US008462553B2

(12) United States Patent
Lee et al.

(10) Patent No.: US 8,462,553 B2
(45) Date of Patent: Jun. 11, 2013

(54) CELL ARRAY FOR HIGHLY-SCALABLE, BYTE-ALTERABLE, TWO-TRANSISTOR FLOTOX EEPROM NON-VOLATILE MEMORY

(75) Inventors: Peter Wung Lee, Saratoga, CA (US); Fu-Chang Hsu, San Jose, CA (US)

(73) Assignee: Aplus Flash Technology, Inc., San Jose, CA (US)

(*) Notice: Subject to any disclaimer, the term of this patent is extended or adjusted under 35 U.S.C. 154(b) by 160 days.

(21) Appl. No.: 12/930,022

(22) Filed: Dec. 23, 2010

(65) Prior Publication Data

US 2011/0157974 A1 Jun. 30, 2011

Related U.S. Application Data

(60) Provisional application No. 61/284,973, filed on Dec. 29, 2009.

(51) Int. Cl.
*G11C 11/34* (2006.01)

(52) U.S. Cl.
USPC .................................. 365/185.2; 365/185.24

(58) Field of Classification Search
USPC .......................................... 365/185.2, 185.24
See application file for complete search history.

(56) References Cited

U.S. PATENT DOCUMENTS

| 4,599,707 A | 7/1986 | Fang |
| 5,187,683 A | 2/1993 | Gill et al. |
| 6,479,347 B1 | 11/2002 | Dalla Libera et al. |
| 6,697,281 B2 | 2/2004 | Hoang |
| 6,850,438 B2* | 2/2005 | Lee et al. ................. 365/185.11 |
| 6,894,343 B2* | 5/2005 | Harari et al. .................. 257/319 |
| 7,006,381 B2 | 2/2006 | Dormans et al. |
| 2006/0221682 A1* | 10/2006 | Chih .......................... 365/185.1 |
| 2009/0279360 A1 | 11/2009 | Lee et al. |
| 2009/0310414 A1 | 12/2009 | Lee et al. |
| 2010/0002524 A1 | 1/2010 | Sekiguchi |

OTHER PUBLICATIONS

ISSCC 80 / Feb. 14, 1980, Session XII: ROMs, PROMs and EROMs, THPM 12.6: "A 16Kb Electrically Erasable Nonvolatile Memory," by William S. Johnson et al., Intel Corp., Santa Clara, CA, 3 pgs.
"Analysis and Modeling of Floating-Gate EEPROM Cells," by Avinoam Kolodny et al., IEEE Transactions on Electron Devices, vol. ED-33, No. 6, Jun. 1986, pp. 835-844.

* cited by examiner

*Primary Examiner* — Michael Tran
(74) *Attorney, Agent, or Firm* — Saile Ackerman LLC; Stephen B. Ackerman; Billy Knowles

(57) ABSTRACT

Two-transistor FLOTOX EEPROM cells are collected to form an alterable unit such as a byte. Each of the two-transistor FLOTOX EEPROM cells has a bit line connected to a drain of a select transistor of each of the two-transistor FLOTOX EEPROM cells and a source line placed in parallel with the bit line and connected to a source of a floating gate transistor of each of the two-transistor FLOTOX EEPROM cells. In a program operation, the bit lines are connected to a very large programming voltage level and the source lines are connected to a punch through inhibit voltage level. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

58 Claims, 8 Drawing Sheets

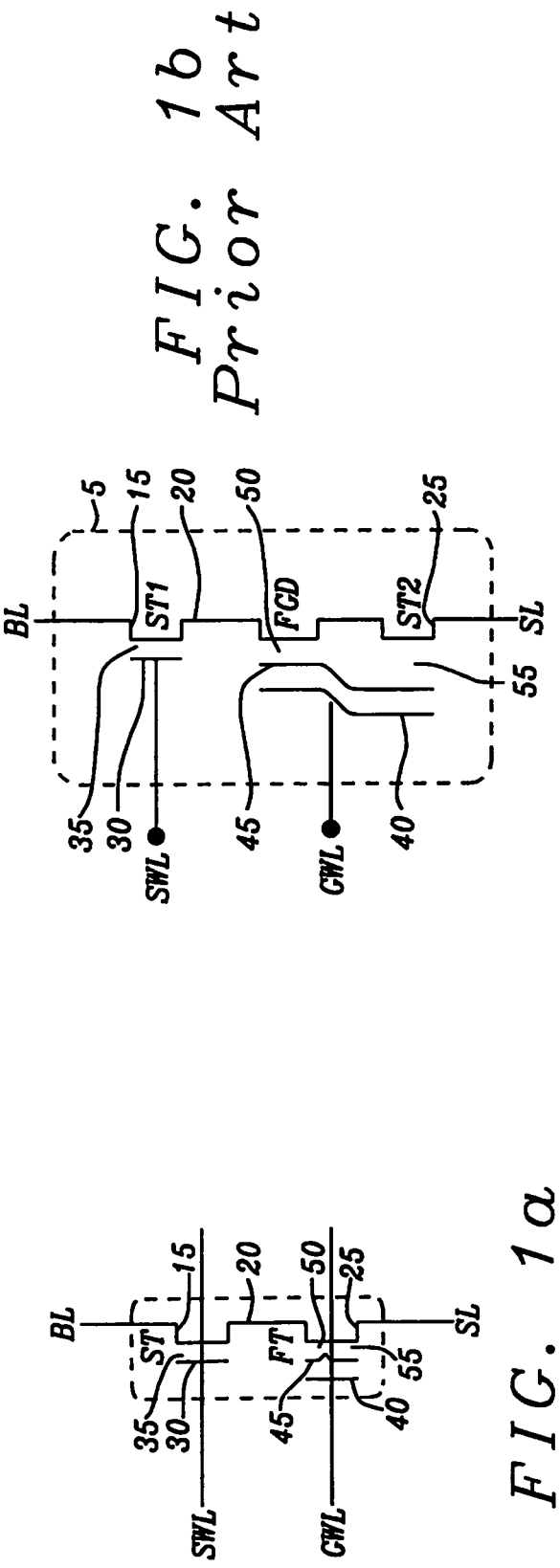
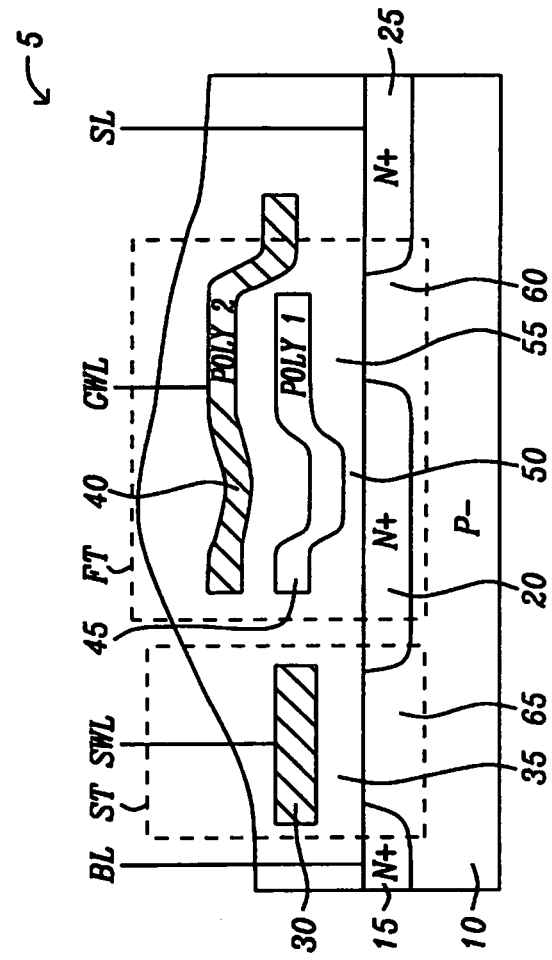
FIG. 1a Prior Art
FIG. 1b Prior Art
FIG. 1c Prior Art

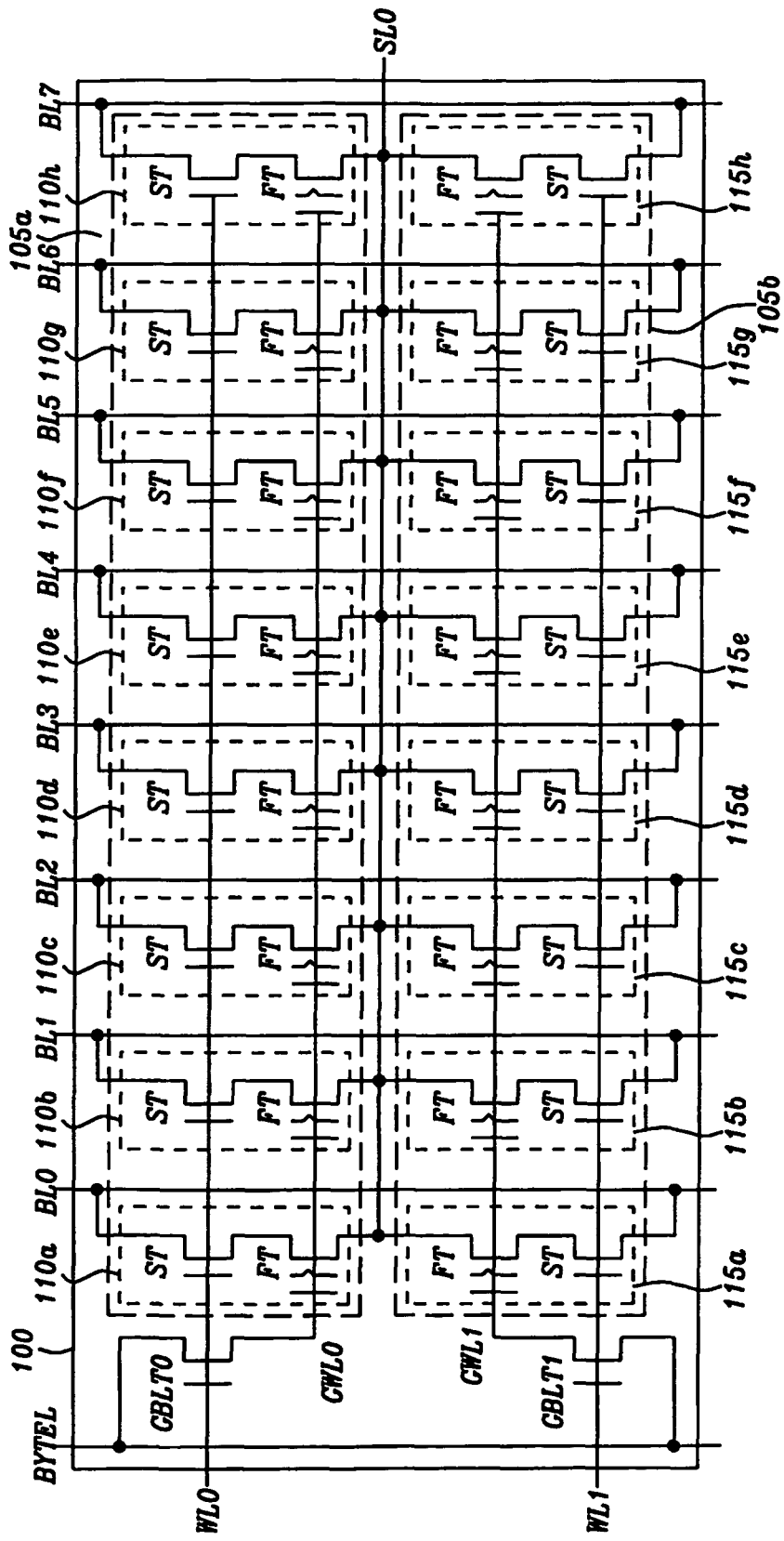
FIG. 2 – Prior Art

Operation Table of Selected FLOTOX EEPROM Cell

| Operation | BL | SL | WL | CWL |
|---|---|---|---|---|
| READ | Vrdb | 0V | VDD | Vread |
| ERASE | 0V | 0V | HV | HV |
| PROGRAM | HV | 0V or floating | HV | 0V or Floating |

Note: HV = 15V to 17V, Vread = 0V to 1V, Vrdb < 1.0V

*FIG. 3a – Prior Art*

Operation Table of Non-selected FLOTOX EEPROM Cell

| Operation | BL | SL | WL | CWL |
|---|---|---|---|---|
| READ | Vrdb (Sel Col)/ 0V (UnSel Col) | 0V | Vread (Sel Row)/ 0V (UnSel Row) | 0V or Floating |
| ERASE | 0V | 0V | 0V | 0V or Floating |
| PROGRAM | HV (Sel Col)/ 0V (UnSel Col) | 0V or floating | HV (UnSel Row)/ 0V (UnSel Row) | 0V or Floating |

Note: HV = 15V to 17V, Vread = 0V to 1V, Vrdb < 1.0V

*FIG. 3b – Prior Art*

Operation Table of Selected FLOTOX EEPROM Cell

| Operation | BL | SL | WL | CWL |
|---|---|---|---|---|
| READ | Vrdb | 0V | VDD | Vread |
| ERASE | 0V | 0V | HV | HV-Vt |
| PROGRAM | HV | HV1 | HV | 0V |

Note: Vrdb<1.0V, Vread=0V-1V, HV=15V-17V, HV1≅1/2HV=6V-8V, Vgate=3V-5V

FIG. 6a

Operation Table of Non-selected FLOTOX EEPROM Cell

| Operation | BL | SL | WL | CWL |
|---|---|---|---|---|
| READ | Vrdb | 0V | 0V | Floating |
| ERASE | 0V | 0V | 0V | Floating |
| PROGRAM | HV | HV1 | Vgate | Vgate-Vt |

Note: Vrdb<1.0V, Vread=0V-1V, HV=15V-17V, HV1≅1/2HV=6V-8V, Vgate=3V-5V

FIG. 6b

Operation Table of Non-selected FLOTOX EEPROM Cell Same Row

| Operation | BL | SL | WL | CWL |
|---|---|---|---|---|
| READ | 0V | 0V | VDD | 0V |
| ERASE | 0V | 0V | HV | 0V |
| PROGRAM | 0V | 0V | HV | 0V |

Note: HV=15V to 17V, Vread 0V to 1V, HV1≅2HV=5V-8V, Vgate=3V-5V

FIG. 6c

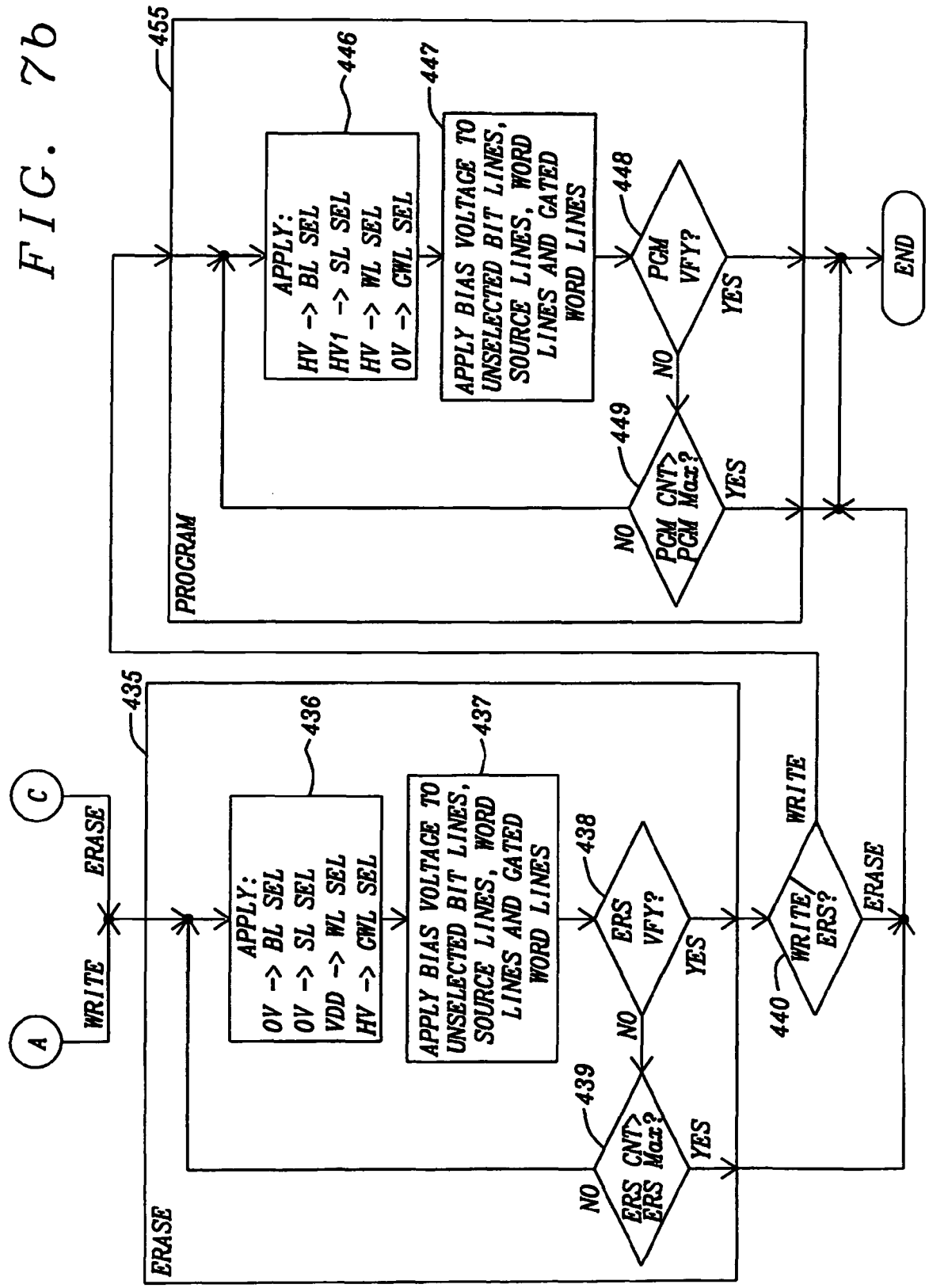

CELL ARRAY FOR HIGHLY-SCALABLE, BYTE-ALTERABLE, TWO-TRANSISTOR FLOTOX EEPROM NON-VOLATILE MEMORY

This application claims priority under 35 U.S.C. §119 to U.S. Provisional Patent Application Ser. No. 61/284,973, filed on Dec. 29, 2009, assigned to the same assignee as the present invention, and incorporated herein by reference in its entirety.

RELATED PATENT APPLICATIONS

U.S. patent application Ser. No. 12/455,337, filed on Jun. 1, 2009, issued on Feb. 21, 2012, as U.S. Pat. No. 8,120,959, assigned to the same assignee as the present invention, and incorporated herein by reference in its entirety.

U.S. patent application Ser. No. 12/387,771, filed on May 7, 2009, issued on Dec. 6, 2011, as U.S. Pat. No. 8,072,811, assigned to the same assignee as the present invention, and incorporated herein by reference in its entirety.

BACKGROUND OF THE INVENTION

1. Field of the Invention

This invention relates generally to a nonvolatile memory circuits, devices, and methods of operation. More particularly, this invention relates to floating gate tunneling oxide (FLOTOX) electrically erasable programmable read only memory EEPROM circuits, devices, and method of operation.

2. Description of Related Art

"A 16 Kb Electrically Erasable Nonvolatile Memory" Johnson, et al., Digest of Technical Papers 1980 IEEE International Solid-State Circuits Conference, February 1980, Volume: XXIII, pp: 152-153 describes an electrically erasable nonvolatile memory using a Floating Gate Tunnel Oxide (FLOTOX) two-transistor cell. The cell size was 0.85 mil$^2$ using 3.5 µm technology. Tunnel oxide thickness was less than 200 Angstrom, and endurance of more than $10^5$ cycles. This cell and the design techniques were widely adopted by the industry on many other memories.

Referring to FIGS. 1a-1c, a two-transistor FLOTOX EEPROM cell structure 5 has a single polycrystalline select transistor ST and a double polycrystalline floating-gate transistor FT. The two-transistor FLOTOX EEPROM cell structure 5 is formed on a P-type substrate 10. An N-type impurity is diffused into the surface of the P-type substrate 10 to form the N+ drain 15 of the select transistor ST, the merged N+ source/drain 20 of the select transistor ST and the floating gate transistor FT, and the source 25 of the floating gate transistor FT. A silicon oxide layer is formed over the surface of the P-type substrate 10. In an area over the floating gate transistor FT region of the merged N+ source/drain 20, the silicon oxide layer is thinned to form the thin oxide region 50 of the floating gate transistor FT. A first polycrystalline silicon layer is formed on top of the silicon oxide layer generally in the region of the thin oxide region 50 to form the floating gate 50 of the floating gate transistor FT. The area of the silicon oxide layer essentially between the N+ drain 15 and the merged N+ source/drain 20 and the area of the silicon oxide layer between the merged N+ source/drain 20 and the source 25 form the thick oxide regions 35 and 55, respectively. A second polycrystalline layer is formed over the thick oxide region 35 between the N+ drain 15 and the merged N+ source/drain 20 to form the gate 30 of the select transistor ST. The second polycrystalline layer is also formed on top of the thick oxide region 55 and the first polycrystalline silicon layer 50 to form the control gate of the floating gate transistor FT.

The N+ drain 15 of the select transistor ST is connected to a bit line BL and the gate of the select transistor ST is connected to a select word line SWL. The source 25 of the floating gate transistor FT is connected to a source line SL. The control gate 40 of the floating gate transistor FT is connected to a gated word line GWL.

The two-transistor FLOTOX EEPROM cell structure 5 is in reality a three device cell. The floating gate transistor FT is the merging of a floating gate charge storage device FGD with a second switching device ST2, as shown in FIG. 1b. The gate of the switching device ST2 may be a single polycrystalline structure formed of the first level polycrystalline silicon layer (not shown), the second poly crystalline layer 40, or a shorted second of the first and second polycrystalline layers (not shown).

The select transistor ST1 is a high-voltage high voltage enhancement-mode NMOS device designed to sustain a very large programming voltage level (approximately 16V) applied to the bit line during programming. The select transistors ST1 and ST2 are structured on each side of the floating gate charge storage device to prevent high voltage disturbance or punch-through of the floating gate charge storage device FGD during the program operation.

One of the most important features of two-transistor FLOTOX EEPROM cell structure 5 is that it is designed to use the single polarity of positive high-voltage power supply voltage source of approximately 16V to perform both program and erase operations. Thus a much simplified process to manufacture both two-transistor FLOTOX EEPROM cell structure 5 and the associated peripheral devices. The structure eliminates any requirement for any triple-P-well within the deep N-well process steps for forming both two-transistor FLOTOX EEPROM cell structures 5 and the associate high voltage and low voltage devices in peripheral area. A second feature of two-transistor FLOTOX EEPROM cell structure 5 is to adopt the low-current Fowler-Nordheim tunneling phenomenon to perform channel-erase and channel-program. A third feature of the two-transistor FLOTOX EEPROM cell structure 5 is that it permits a unique array architecture, which is capable of organizing the two-transistor FLOTOX EEPROM cell structures 5 into alterable units of multiple cell structures such as nibbles (4 bits), bytes, half-word, words, etc. This capability provides the well-known super endurance cycle performance. Currently, all two-transistor FLOTOX EEPROM cell structure 5 designs can meet the application specification of an extremely high-changing rate of 1 million cycles in unit of byte-data.

A major drawback of the two-transistor FLOTOX EEPROM cell structure 5 is that it requires a large programming voltage (approximately 16V) in the channel region 60 between merged N+ source/drain 20 and source 25 with respect to the control gate 40 that has the ground reference voltage level (0V) applied to it. This allows the successful initiation of the Fowler Nordheim channel program. The very large programming voltage level must be approximately 16V in two-transistor FLOTOX EEPROM cell structure's 5 channel 40 build up a sufficiently large voltage field in the tunneling oxide layer 50 between the floating-gate layer 45 and two-transistor FLOTOX EEPROM cell structure's 5 channel region 60 to initiate the Fowler-Nordheim tunneling. The very large programming voltage level induces the Fowler-Nordheim tunneling effect to extract the electrons out of cell's floating-gate 45 to P-substrate 10 in the channel region 60. The very large programming voltage level in channel region 60 is coupled from the bit line BL through the select transistor ST associated with the corresponding floating-gate transistor FT. For each of the unselected two-transistor FLOTOX EEPROM cell structures 5 connected to the same bit line BL, the length of the channel 65 of the select transistor ST has to be kept sufficiently long to prevent the punch-through when the very large programming voltage level is applied across the channel region 65 between select transistor's ST N+ drain 15 and the merged N+ source/drain 20 during the program operation. As a result of requiring the very large programming voltage level in the two-transistor FLOTOX EEPROM cell structure's 5 channel region 65, the cell size even in the present day designs is still very big and un-scalable. The most advanced two-transistor FLOTOX EEPROM cell 5 technology suitable for economic production stays above 0.13 μm minimum feature in 2009 without foreseeing a practical scaling beyond 0.13 μm in the future.

FIG. 2 is a schematic diagram of a portion of an array 100 of two-transistor FLOTOX EEPROM cells 110a, 110b, ..., 110h and 115a, 115b, ..., 115h showing two byte-alterable units 105a and 105b. Each of the two-transistor FLOTOX EEPROM cells 110a, 110b, ..., 110h and 115a, 115b, ..., 115h is formed of a select transistor ST and a floating gate transistor FT that is formed and functions as described above in FIGS. 1a, 1b, and 1c. The drains of the select transistors ST of the two-transistor FLOTOX EEPROM cells 110a, 110b, ..., 110h and 115a, 115b, ..., 115h are connected to the bit lines BL0, BL1, ..., BL7. The two-transistor FLOTOX EEPROM cells 110a, 110b, ..., 110h and 115a, 115b, ..., 115h that are arranged column-wise are commonly connected to an associated bit line BL0, BL1, ..., BL7. The sources of the floating gate transistors FT of all the two-transistor FLOTOX EEPROM cells 110a, 110b, ..., 110h and 115a, 115b, ..., 115h are connected to a common source line SL0. In many implementations of the arrays of the two-transistor FLOTOX EEPROM cells 110a, 110b, ..., 110h and 115a, 115b, ..., 115h, the common source line SL0 is connected to the ground reference voltage level. As structured, the common source line SL0 is placed parallel to the word lines WL0 and WL1 and essentially connects the every two-transistor FLOTOX EEPROM cell 110a, 110b, ..., 110h and 115a, 115b, ..., 115h of the array 100 into an integrated unit.

The word line WL0 is connected to the gates of the select transistors ST of the two-transistor FLOTOX EEPROM cells 110a, 110b, ..., 110h of the byte-alterable unit 105a. The word line WL1 is connected to the gates of the select transistors ST of the two-transistor FLOTOX EEPROM cells 115a, 115b, ..., 115h of the byte-alterable unit 105b. Each of the byte-alterable units 105a and 105b further includes a gated bit line select transistor GBLT0 and GBLT1. The gate of the gated bit line select transistor GBLT0 is connected to the word line WL0 and the gate of the gated bit line select transistor GBLT1 is connected to the word line WL1. The drains of the gated bit line select transistor GBLT0 and GBLT1 are connected to the gated bit line BYTEL. The sources of the gated bit line select transistor GBLT0 and GBLT1 are connected to the control gates of the floating gate transistors FT of the respective byte-alterable units 105a and 105b.

FIGS. 3a and 3b are tables of the biasing voltages for operating a FLOTOX EEPROM memory device. The table of FIG. 3a illustrates the biasing voltages applied to the bit lines BL, source lines SL, word lines BL, and gated word lines through the gated bit line select transistor GBLT0 or GBLT1 from the gated bit line BYTEL for the selected two-transistor FLOTOX EEPROM cells 110a, 110b, ..., 110h or 115a, 115b, ..., 115h that are selected to be read, erased, or programmed. The table of FIG. 3b illustrates the biasing voltages applied to the bit lines BL, source lines SL, word lines BL, and gated word lines through the gated bit line select transistor GBLT0 or GBLT1 from the gated bit line BYTEL for the selected two-transistor FLOTOX EEPROM cells 110a, 110b, ..., 110h or 115a, 115b, ..., 115h that are unselected from being read, erased, or programmed.

For those unselected two-transistor FLOTOX EEPROM cells 110a, 110b, ..., 110h or 115a, 115b, ..., 115h on the same column and connected to the same bit lines BL0, BL1, ..., BL7 as the selected two-transistor FLOTOX EEPROM cells 110a, 110b, ..., 110h or 115a, 115b, ..., 115h, the channel length of the select transistors ST has to be of a sufficient magnitude to prevent punch-through with the very large programming voltage (HV) developed across over the channel region between the drain and source of the select transistors ST of the unselected two-transistor FLOTOX EEPROM cells 110a, 110b, ..., 110h or 115a, 115b, ..., 115h during the program operation. As a result of requiring the very large programming voltage in the channel region of the select transistors ST of the unselected two-transistor FLOTOX EEPROM cells 110a, 110b, ..., 110h or 115a, 115b, ..., 115h, the size of the two-transistor FLOTOX EEPROM cells 110a, 110b, ..., 110h or 115a, 115b, ..., 115h is still very large and is not scalable.

What is needed is a reliable and scalable two-transistor FLOTOX EEPROM cell structure and array structure beyond the 0.13 μm technology processing size that achieves 1 million endurance cycles, while preventing high voltage disturbance or punch-through.

SUMMARY OF THE INVENTION

An object of this invention is to provide a two-transistor FLOTOX EEPROM cell that prevents punch-through and high voltage disturbances during cell programming.

Another object of this invention is to provide an array of two-transistor FLOTOX EEPROM cells that do not incur punch-through and high voltage disturbances during cell programming.

Further another object of this invention is to provide a method of operation of a two-transistor FLOTOX EEPROM device that does not incur punch-through and high voltage disturbances during cell programming.

To accomplish at least one of these objects, in various embodiments, a plurality of two-transistor FLOTOX EEPROM cells is collected to form an alterable unit. Each of the two-transistor FLOTOX EEPROM cells has a metal bit line connected to a drain of a select transistor of each of the two-transistor FLOTOX EEPROM cells and a metal source line placed in parallel with the metal bit line and connected to a source of a floating gate transistor of each of the two-transistor FLOTOX EEPROM cells. The alterable unit of the two-transistor FLOTOX EEPROM cells further has a bit line gating transistor. The bit line gating transistor has a drain connected to a gating bit line and a source connected to a gated word line that is connected to each of the control gates of the floating gate transistors of each of the two-transistor FLOTOX EEPROM cells. A word line is connected to the gate of each select transistor of each of the two-transistor FLOTOX EEPROM cells and to the gate of the bit line gating transistor. The word line and the gated word line are perpendicular to each of the metal bit lines and source lines. The metal bit lines and metal source lines are connected such that, when in a program operation, the drain to source voltage of each of the select transistors and the floating gate transistors is less than a drain-to-source breakdown voltage of the select transistors and the floating gate transistors. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

In assorted embodiments, the alterable unit of the two-transistor FLOTOX EEPROM cells is a nibble (4 bits), a byte, a half-word (16 bits), a word, or any number of two-transistor FLOTOX EEPROM cells.

In various embodiments, the alterable-unit of two-transistor FLOTOX EEPROM cells is erased by applying a ground reference voltage level (0V) to the bit line and thus to the drain of the select transistor of each of the two-transistor FLOTOX EEPROM cells of the alterable-unit. The ground reference voltage level (0V) is applied to the source line and thus to the source of the floating gate transistor of each of the two-transistor FLOTOX EEPROM cells of the alterable-unit. A voltage level of the very large erasing voltage is applied to the word line. A very large erasing voltage is applied to the gating bit line and since the power supply voltage source is applied to the gate of the bit line gating transistor, the very large erasing voltage is applied to each of the control gates of the floating gate transistors. The very large erasing voltage causes a voltage field between the floating gate and the channel of the floating gate transistors through a thin oxide to initiate a Fowler-Nordheim tunneling to erase the two-transistor FLOTOX EEPROM cells. In some embodiments, the very large erasing voltage has a magnitude of from approximately 15V to approximately 17V.

In various embodiments, the alterable-unit of two-transistor FLOTOX EEPROM cells is inhibited from being erased by applying a ground reference voltage level (0V) to the bit line and thus to the drain of the select transistor of each of the two-transistor FLOTOX EEPROM cells of the alterable-unit. The ground reference voltage level (0V) is applied to the source line and thus to the source of the floating gate transistor of each of the two-transistor FLOTOX EEPROM cells of the alterable-unit. The ground reference voltage level is applied to the word line and the gated bit line. In other embodiments the gated bit line is disconnected and allowed to float. There is no voltage field between the floating gate and the channel of the floating gate transistors through a thin oxide and the Fowler-Nordheim tunneling is not initiated.

In some embodiments, at least one FLOTOX EEPROM cell within a selected alterable-unit of two-transistor FLOTOX EEPROM cells is programmed by applying a very large programming voltage to the bit line and thus to the drain of the select transistor of each of the two-transistor FLOTOX EEPROM cells of the alterable-unit. A punch-through inhibit programming voltage is applied to the source line and thus to the source of the floating gate transistor of each of the two-transistor FLOTOX EEPROM cells of the alterable-unit. The very large programming voltage is applied to the word line. The gating bit line is connected to the ground reference voltage level. Since the very large programming voltage is applied to the gate of the bit line gating transistor, the gated word lines and thus the control gates of the floating gate transistors are connected to the ground reference voltage level in some embodiments. The very large programming voltage causes a voltage field between the channel of the floating gate transistors and the floating gate through a thin oxide to initiate a Fowler-Nordheim tunneling to program the two-transistor FLOTOX EEPROM cells. In some embodiments, the very large programming voltage has a magnitude of from approximately 15V to approximately 17V.

In various embodiments, unselected two-transistor FLOTOX EEPROM cells within the selected alterable-unit of two-transistor FLOTOX EEPROM cells are inhibited from programming by setting the bit lines and source lines connected to the ground reference voltage level. There is no voltage field between the channel of the floating gate transistors and the floating gate through the thin oxide to is prevent initiation of the Fowler-Nordheim tunneling and programming the unselected two-transistor FLOTOX EEPROM cells.

In various embodiments, the unselected two-transistor FLOTOX EEPROM cells on the same column as the at least one two-transistor FLOTOX EEPROM cells selected for programming are inhibited from being programmed by applying the very large programming voltage to the bit line and thus to the drain of the select transistor of each of the two-transistor FLOTOX EEPROM cells of the alterable-unit. The punch-through inhibit programming voltage is applied to the source line and thus to the source of the floating gate transistor of each of the two-transistor FLOTOX EEPROM cells of the alterable-unit. A program inhibit gating voltage level is applied to the word line that is sufficient to turn on the select transistor to set the channel voltage to a threshold voltage level less than the high programming voltage level. The ground reference voltage level is applied to the gated bit line and thus to the gated word line. The program inhibit gating voltage level less a threshold voltage level of the select transistor is place at a drain of the floating gate transistor and the punch-through inhibit programming voltage is placed at the source of the floating gate transistor to provide a drain-to-source voltage level of the select transistor and the floating gate transistor less than the drain-to-source breakdown voltage level of the select transistor and the floating gate transistor of each of the unselected two-transistor FLOTOX EEPROM cells place on the same column as the selected at least one two-transistor FLOTOX EEPROM cell of the selected alterable-unit. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

In various embodiments, the alterable-unit of two-transistor FLOTOX EEPROM cells is read by applying a read biasing voltage to the bit line and thus to the drain of the select transistor of each of the two-transistor FLOTOX EEPROM cells of the alterable-unit. The ground reference voltage level is applied to the source line and thus to the source of the floating gate transistor of each of the two-transistor FLOTOX EEPROM cells of the alterable-unit. The voltage level of the power supply voltage source is applied to the word line. A read reference voltage level is applied to the gating bit line. Since the voltage level of the power supply voltage source is applied to the gate of the bit line gating transistor, the gated word lines and thus the control gates of the floating gate transistors are connected to the read reference voltage level. A sense amplifier connected to the source line detects the program state of the selected two-transistor FLOTOX EEPROM cells.

In various embodiments, the alterable-unit of two-transistor FLOTOX EEPROM cells is inhibited from being read by applying a read biasing voltage to the bit line and thus to the drain of the select transistor of each of the two-transistor FLOTOX EEPROM cells of the alterable-unit. The ground reference voltage level is applied to the source line and thus to the source of the floating gate transistor of each of the two-transistor FLOTOX EEPROM cells of the alterable-unit. The voltage level of the power supply voltage source is applied to the word line. The ground reference voltage level is applied to the gating bit line. Since the voltage level of the power supply voltage source is applied to the gate of the bit line gating transistor, the gated word lines and thus the control gates of the floating gate transistors are connected to the ground reference voltage level to insure that the unselected two-transistor FLOTOX EEPROM cells are inhibited from being read.

In other embodiments, a FLOTOX EEPROM memory device has an array of two-transistor FLOTOX EEPROM cells arranged in rows and columns. On each row of the array of the two-transistor FLOTOX EEPROM cells, a plurality of two-transistor FLOTOX EEPROM cells is collected to form an alterable unit. The two-transistor FLOTOX EEPROM cells on each column has a metal bit line connected to a drain of a select transistor of each of the two-transistor FLOTOX EEPROM cells and a metal source line placed in parallel with the metal bit line and connected to a source of a floating gate transistor of each of the two-transistor FLOTOX EEPROM cells. Each of the alterable units of the two-transistor FLOTOX EEPROM cells further has a bit line gating transistor. The bit line gating transistor has a drain connected to a gating bit line and a source connected to a gated word line that is connected to each of the control gates of the floating gate transistors of each of the two-transistor FLOTOX EEPROM cells. A word line is connected to the gate of each select transistor of each of the two-transistor FLOTOX EEPROM cells and to the gate of the bit line gating transistor. The word line and the gated word line are perpendicular to each of the metal bit lines and source lines. The metal bit lines and metal source lines are connected such that, when in a program operation, the drain to source voltage of each of the select transistors and the floating gate transistors is less than a drain-to-source breakdown voltage of the select transistors and the floating gate transistors. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

In assorted embodiments of the FLOTOX EEPROM memory device, the alterable unit of the two-transistor FLOTOX EEPROM cells is a nibble (4 bits), a byte, a half-word (16 bits), a word, or any number of two-transistor FLOTOX EEPROM cells.

In various embodiments of the FLOTOX EEPROM memory device, one or more selected alterable-units two-transistor FLOTOX EEPROM cells is erased by applying a ground reference voltage level (0V) to the bit line and thus to the drain of the select transistor of each of the two-transistor FLOTOX EEPROM cells of the one or more alterable-unit. The ground reference voltage level (0V) is applied to the source line and thus to the source of the floating gate transistor of each of the two-transistor FLOTOX EEPROM cells of the one or more alterable-units. A voltage level of the power supply voltage source is applied to the word line. A very large erasing voltage is applied to the gating bit line and since the power supply voltage source is applied to the gate of the bit line gating transistor, the very large erasing voltage is applied to each of the control gates of the floating gate transistors attached to the gated word line. The very large erasing voltage causes a voltage field between the floating gate and the channel of the floating gate transistors through a thin oxide to initiate a Fowler-Nordheim tunneling to erase the two-transistor FLOTOX EEPROM cells. In some embodiments, the very large erasing voltage has a magnitude of from approximately 15V to approximately 17V.

In various embodiments of the FLOTOX EEPROM memory device, the unselected alterable-units of two-transistor FLOTOX EEPROM cells are inhibited from being erased by applying a ground reference voltage level (0V) to the bit line and thus to the drain of the select transistor of each of the two-transistor FLOTOX EEPROM cells of the alterable-units. The ground reference voltage level (0V) is applied to the source line and thus to the source of the floating gate transistor of each of the two-transistor FLOTOX EEPROM cells of the alterable-units. The ground reference voltage level is applied to the word line and the gated bit line. In other embodiments the gated bit line is disconnected and allowed to float. There is no voltage field between the floating gate and the channel of the floating gate transistors through a thin oxide and the Fowler-Nordheim tunneling is not initiated.

In some embodiments of the FLOTOX EEPROM memory device, one or more selected alterable-units two-transistor FLOTOX EEPROM cells is programmed by applying a very large programming voltage to the bit line and thus to the drain of the select transistor of each of the two-transistor FLOTOX EEPROM cells of the one or more alterable-unit. A punch-through inhibit programming voltage is applied to the source line and thus to the source of the floating gate transistor of each of the two-transistor FLOTOX EEPROM cells of the one or more alterable-units. The very large programming voltage is applied to the word line. The gating bit line is connected to the ground reference voltage level. Since the very large programming voltage is applied to the gate of the bit line gating transistor, the gated word lines and thus the control gates of the floating gate transistors are connected to the ground reference voltage level. The very large programming voltage causes a voltage field between the channel of the floating gate transistors and the floating gate through a thin oxide to initiate a Fowler-Nordheim tunneling to program the two-transistor FLOTOX EEPROM cells. In some embodiments, the very large programming voltage has a magnitude of from approximately 15V to approximately 17V.

In various embodiments of the FLOTOX EEPROM memory device, unselected two-transistor FLOTOX EEPROM cells within the selected alterable-unit of two-transistor FLOTOX EEPROM cells are inhibited from programming by setting the bit lines and source lines connected to the unselected alterable-unit of two-transistor FLOTOX EEPROM cells. There is no voltage field between the channel of the floating gate transistors and the floating gate through the thin oxide to is prevent initiation of the Fowler-Nordheim tunneling and programming the unselected two-transistor FLOTOX EEPROM cells.

In various embodiments of the FLOTOX EEPROM memory device, the unselected two-transistor FLOTOX EEPROM cells on the same column as the at least one two-transistor FLOTOX EEPROM cells selected for programming are inhibited from being programmed by applying the very large programming voltage to the bit line and thus to the drain of the select transistor of each of the two-transistor FLOTOX EEPROM cells of the alterable-unit. The punch-through inhibit programming voltage is applied to the source line and thus to the source of the floating gate transistor of each of the two-transistor FLOTOX EEPROM cells of the alterable-unit. A program inhibit gating voltage level is applied to the word line that is sufficient to turn on the select transistor to set the channel voltage to a threshold voltage level less than the high programming voltage level. The ground reference voltage level is applied to the gated bit line and thus to the gated word line. The program inhibit gating voltage level less a threshold voltage level of the select transistor is place at a drain of the floating gate transistor and the punch-through inhibit programming voltage is placed at the source of the floating gate transistor to provide a drain-to-source voltage level of the select transistor and the floating gate transistor less than the drain-to-source breakdown voltage level of the select transistor and the floating gate transistor of each of the unselected two-transistor FLOTOX EEPROM cells place on the same column as the selected at least one two-transistor FLOTOX EEPROM cell of the selected alterable-unit. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

In various embodiments of the FLOTOX EEPROM memory device, one or more of the alterable-units of the two-transistor FLOTOX EEPROM cells is read by applying a read biasing voltage to the bit line and thus to the drain of the select transistor of each of the two-transistor FLOTOX EEPROM cells of the alterable-unit. The ground reference voltage level is applied to the source line and thus to the source of the floating gate transistor of each of the two-transistor FLOTOX EEPROM cells of the alterable-unit. The voltage level of the power supply voltage source is applied to the word line. A read reference voltage level is applied to the gating bit line. Since the voltage level of the power supply voltage source is applied to the gate of the bit line gating transistor, the gated word lines and thus the control gates of the floating gate transistors are connected to the read reference voltage level. A sense amplifier connected to the source line detects the program state of the selected two-transistor FLOTOX EEPROM cells.

In various embodiments of the FLOTOX EEPROM memory device, the alterable-units of the two-transistor FLOTOX EEPROM cells are inhibited from being read by applying a read biasing voltage to the bit line and thus to the drain of the select transistor of each of the two-transistor FLOTOX EEPROM cells of the alterable-unit. The ground reference voltage level is applied to the source line and thus to the source of the floating gate transistor of each of the two-transistor FLOTOX EEPROM cells of the alterable-unit. The voltage level of the power supply voltage source is applied to the word line. The ground reference voltage level is applied to the gating bit line. Since the voltage level of the power supply voltage source is applied to the gate of the bit line gating transistor, the gated word lines and thus the control gates of the floating gate transistors are connected to the ground reference voltage level to insure that the unselected two-transistor FLOTOX EEPROM cells are inhibited from being read.

In other embodiments, method of forming a FLOTOX EEPROM memory device begins by creating an array of two-transistor FLOTOX EEPROM cells on a substrate. The two-transistor FLOTOX EEPROM cells are arranged in rows and columns. On each row of the array of the two-transistor FLOTOX EEPROM cells, a plurality of two-transistor FLOTOX EEPROM cells is collected to form one or more alterable units. The two-transistor FLOTOX EEPROM cells on each column has a metal bit line connected to a drain of a select transistor of each of the two-transistor FLOTOX EEPROM cells and a metal source line placed in parallel with the metal bit line and connected to a source of a floating gate transistor of each of the two-transistor FLOTOX EEPROM cells. A bit line gating transistor is formed to be associated with each of the alterable units of the two-transistor FLOTOX EEPROM cells. The bit line gating transistor has a drain connected to a gating bit line and a source connected to a gated word line that is connected to each of the control gates of the floating gate transistors of each of the two-transistor FLOTOX EEPROM cells. A word line is connected to the gate of each select transistor of each of the two-transistor FLOTOX EEPROM cells and to the gate of the bit line gating transistor. The word line and the gated word line are situated to be perpendicular to each of the metal bit lines and source lines. The metal bit lines and metal source lines are connected such that, when in a program operation, the drain to source voltage of each of the select transistors and the floating gate transistors is less than a drain-to-source breakdown voltage of the select transistors and the floating gate transistors. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

In assorted embodiments of the method of forming the FLOTOX EEPROM memory device, the alterable unit of the two-transistor FLOTOX EEPROM cells is a nibble (4 bits), a byte, a half-word (16 bits), a word, or any number of two-transistor FLOTOX EEPROM cells.

In various embodiments, a method of operation of the FLOTOX EEPROM memory device includes erasing one or more selected alterable units of the two-transistor FLOTOX EEPROM cells. The one or more selected alterable-units two-transistor FLOTOX EEPROM cells are erased by applying a ground reference voltage level (0V) to the bit line and thus to the drain of the select transistor of each of the two-transistor FLOTOX EEPROM cells of the one or more alterable-unit. The ground reference voltage level (0V) is applied to the source line and thus to the source of the floating gate transistor of each of the two-transistor FLOTOX EEPROM cells of the one or more alterable-units. A voltage level of the very large erasing voltage is applied to the word line. A very large erasing voltage is applied to the gating bit line and since the power supply voltage source is applied to the gate of the bit line gating transistor, the very large erasing voltage is applied to each of the control gates of the floating gate transistors attached to the gated word line. The very large erasing voltage causes a voltage field between the floating gate and the channel of the floating gate transistors through a thin oxide to initiate a Fowler-Nordheim tunneling to erase the two-transistor FLOTOX EEPROM cells. In some embodiments, the very large erasing voltage has a magnitude of from approximately 15V to approximately 17V.

In various embodiments, in the method of operation of the FLOTOX EEPROM memory device, erasing includes inhibiting the unselected alterable-units of two-transistor FLOTOX EEPROM cells from being erased. The unselected alterable-units of the two-transistor FLOTOX EEPROM cells are inhibited from being erased by applying a ground reference voltage level (0V) to the bit line and thus to the drain of the select transistor of each of the two-transistor FLOTOX EEPROM cells of the alterable-units. The ground reference voltage level (0V) is applied to the source line and thus to the source of the floating gate transistor of each of the two-transistor FLOTOX EEPROM cells of the alterable-units. The ground reference voltage level is applied to the word line and the gated bit line. In other embodiments the gated bit line is disconnected and allowed to float. There is no voltage field between the floating gate and the channel of the floating gate transistors through a thin oxide and the Fowler-Nordheim tunneling is not initiated.

In some embodiments, the method of operation of the FLOTOX EEPROM memory device includes programming one or more selected alterable-units two-transistor FLOTOX EEPROM cells. The one or more selected alterable-units two-transistor FLOTOX EEPROM cells are programmed by applying a very large programming voltage to the bit line and thus to the drain of the select transistor of each of the two-transistor FLOTOX EEPROM cells of the one or more alterable-unit. A punch-through inhibit programming voltage is applied to the source line and thus to the source of the floating gate transistor of each of the two-transistor FLOTOX EEPROM cells of the one or more alterable-units. The very large programming voltage is applied to the word line. The gating bit line is connected to the ground reference voltage level. Since the very large programming voltage is applied to the gate of the bit line gating transistor, the gated word lines and thus the control gates of the floating gate transistors are connected to the ground reference voltage level. The very large programming voltage causes a voltage field between the channel of the floating gate transistors and the floating gate through a thin oxide to initiate a Fowler-Nordheim tunneling to program the two-transistor FLOTOX EEPROM cells. In some embodiments, the very large programming voltage has a magnitude of from approximately 15V to approximately 17V.

In various embodiments, in the method of operation of the FLOTOX EEPROM memory device, programming one or more selected alterable-units two-transistor FLOTOX EEPROM cells includes inhibiting programming unselected two-transistor FLOTOX EEPROM cells within the selected alterable-unit of two-transistor FLOTOX EEPROM cells by setting the bit lines and source lines connected to the unselected alterable-unit of two-transistor FLOTOX EEPROM cells to the ground reference voltage level. There is no voltage field between the channel of the floating gate transistors and the floating gate through the thin oxide to is prevent initiation of the Fowler-Nordheim tunneling and programming the unselected two-transistor FLOTOX EEPROM cells.

In various embodiments, in the method of operation of the FLOTOX EEPROM memory device, programming one or more selected alterable-units two-transistor FLOTOX EEPROM cells includes inhibiting programming unselected two-transistor FLOTOX EEPROM cells on the same column as the at least one two-transistor FLOTOX EEPROM cells selected for programming by applying the very large programming voltage to the bit line and thus to the drain of the select transistor of each of the two-transistor FLOTOX EEPROM cells of the alterable-unit. The punch-through inhibit programming voltage is applied to the source line and thus to the source of the floating gate transistor of each of the two-transistor FLOTOX EEPROM cells of the alterable-unit. A program inhibit gating voltage level is applied to the word line that is sufficient to turn on the select transistor to set the channel voltage to a threshold voltage level less than the high programming voltage level. The ground reference voltage level is applied to the gated bit line and thus to the gated word line. The program inhibit gating voltage level less a threshold voltage level of the select transistor is place at a drain of the floating gate transistor and the punch-through inhibit programming voltage is placed at the source of the floating gate transistor to provide a drain-to-source voltage level of the select transistor and the floating gate transistor less than the drain-to-source breakdown voltage level of the select transistor and the floating gate transistor of each of the unselected two-transistor FLOTOX EEPROM cells place on the same column as the selected at least one two-transistor FLOTOX EEPROM cell of the selected alterable-unit.

In various embodiments, the method of operation of the FLOTOX EEPROM memory device includes reading one or more selected alterable-units of the two-transistor FLOTOX EEPROM cells. The one or more selected alterable-units of the two-transistor FLOTOX EEPROM cells is read by applying a read biasing voltage to the bit line and thus to the drain of the select transistor of each of the two-transistor FLOTOX EEPROM cells of the alterable-unit. The ground reference voltage level is applied to the source line and thus to the source of the floating gate transistor of each of the two-transistor FLOTOX EEPROM cells of the alterable-unit. The voltage level of the power supply voltage source is applied to the word line. A read reference voltage level is applied to the gating bit line. Since the voltage level of the power supply voltage source is applied to the gate of the bit line gating transistor, the gated word lines and thus the control gates of the floating gate transistors are connected to the read reference voltage level. A sense amplifier connected to the source line detects the program state of the selected two-transistor FLOTOX EEPROM cells. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

In various embodiments, in the method of operation of the FLOTOX EEPROM memory device, the reading of one or more selected alterable-units of the two-transistor FLOTOX EEPROM cells includes inhibiting reading of unselected alterable-units of the two-transistor FLOTOX EEPROM cells from being read by applying a read biasing voltage to the bit line and thus to the drain of the select transistor of each of the two-transistor FLOTOX EEPROM cells of the alterable-unit. The ground reference voltage level is applied to the source line and thus to the source of the floating gate transistor of each of the two-transistor FLOTOX EEPROM cells of the alterable-unit. The voltage level of the power supply voltage source is applied to the word line. The ground reference voltage level is applied to the gating bit line. Since the voltage level of the power supply voltage source is applied to the gate of the bit line gating transistor, the gated word lines and thus the control gates of the floating gate transistors are connected to the ground reference voltage level to insure that the unselected two-transistor FLOTOX EEPROM cells are inhibited from being read.

BRIEF DESCRIPTION OF THE DRAWINGS

FIGS. 1a and 1b are schematic diagrams of a two-transistor FLOTOX EEPROM cell of the prior art.

FIG. 1c is a diagram of a cross section of a two-transistor FLOTOX EEPROM cell of the prior art.

FIG. 2 is a schematic diagram of a portion of an array of two-transistor FLOTOX EEPROM cells showing two byte-alterable units of the prior art.

FIGS. 3a and 3b are tables of the biasing voltages for operating a FLOTOX EEPROM memory device of the prior art.

FIGS. 6a, 6b, and 6c are tables of the biasing voltages for operating an embodiment a FLOTOX EEPROM memory device.

FIGS. 7a and 7b are a flow chart of an embodiment of a method of operation of a FIGS. 5a and 5b are tables of the biasing voltages for operating a FLOTOX EEPROM memory device of the prior art.

DETAILED DESCRIPTION OF THE INVENTION

Figure 4:
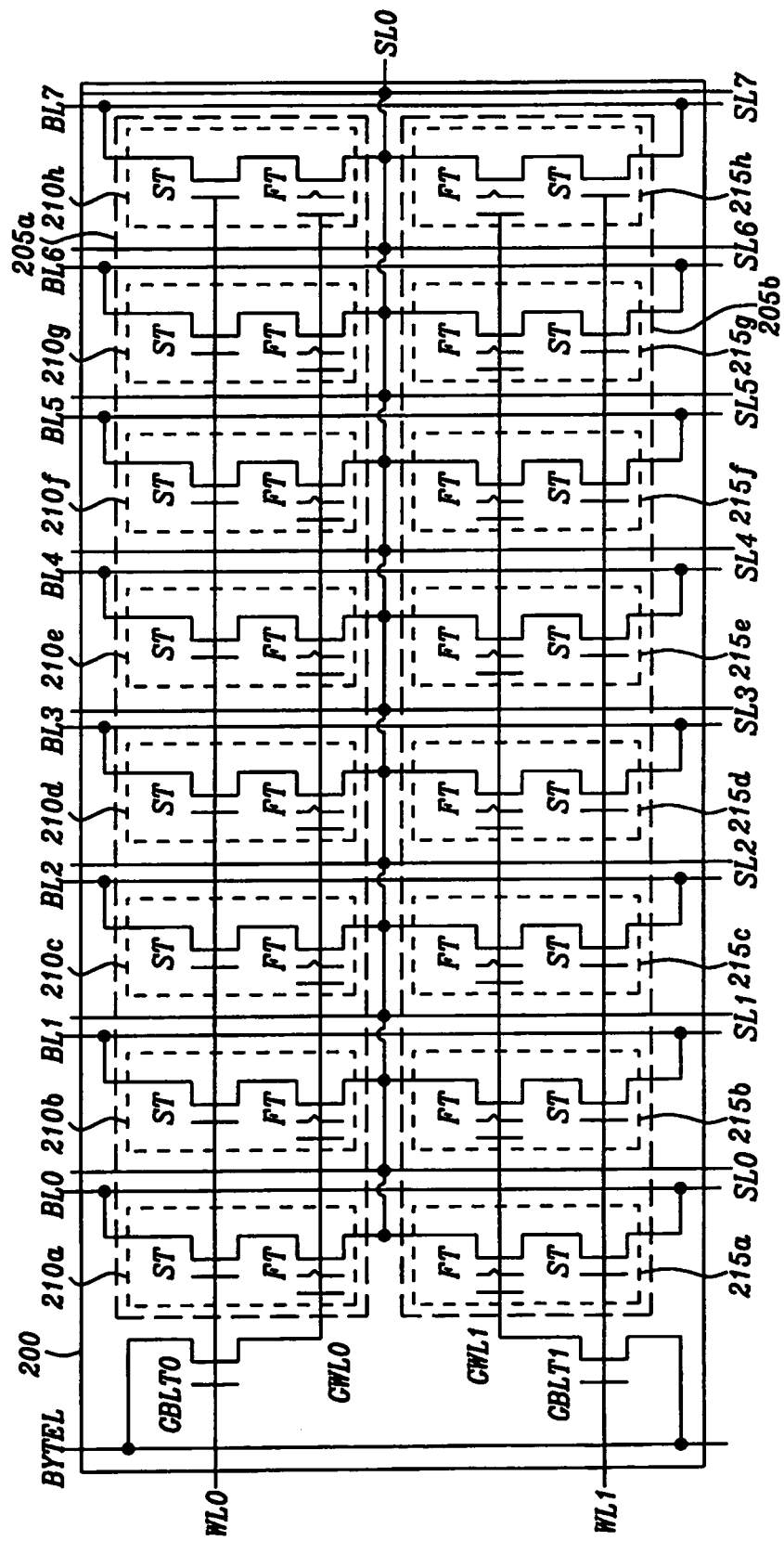
FIG. 4 is a schematic diagram of an embodiment of a portion of an array of two-transistor FLOTOX EEPROM cells showing two byte-alterable units.

In most embodiments, the two-transistor FLOTOX EEPROM cell is formed as described above in FIGS. 1a-1c.

Multiple two-transistor FLOTOX EEPROM cells are collected to form alterable units of two-transistor FLOTOX EEPROM cells. The alterable unit of the two-transistor FLOTOX EEPROM cells further has a bit line gating transistor. The drain of the of the bit line gating transistor is connected to a gated bit line. The two-transistor FLOTOX EEPROM cells have the gates of the select transistors and the gate of the bit line gating transistor connected to a word line. The control gates of the floating gate transistors connected by a gated word line that is connected to the source of the bit line gating transistor. The source lines associated with each column of two-transistor FLOTOX EEPROM cells are segregated and formed as a single source lines connected to the sources of the floating gate transistors on each column. The bit lines are formed in parallel with the sources lines such that in embodiments of an array of the two-transistor FLOTOX EEPROM cells the one bit line and one source line is associated with each column of the two-transistor FLOTOX EEPROM cells. Selected two-transistor FLOTOX EEPROM cells are programmed by setting the bit lines connected to the selected two-transistor FLOTOX EEPROM cells to a very large programming voltage level and the source lines connected to the selected two-transistor FLOTOX EEPROM cells to a punch-through inhibit voltage level. The word line connected to the gate of the select transistors and the bit line gating transistor of the selected alterable-unit of the two-transistor FLOTOX EEPROM cells is set to the very large programming voltage level and a gated bit line is set to the ground reference voltage level. A voltage field between the drain and the control gate of the floating gate transistor initiates a Fowler-Nordheim tunneling to extract electrons from the floating gate.

To inhibit programming unselected two-transistor FLOTOX EEPROM cells within the same alterable-unit of the two-transistor FLOTOX EEPROM cells, the ground reference voltage level is applied the source lines and the bit lines connected to the unselected two-transistor FLOTOX EEPROM cells. Further to inhibit programming for unselected two-transistor FLOTOX EEPROM cells not in the selected alterable unit but connected commonly to the source lines and the bit lines, the word lines for the unselected two-transistor FLOTOX EEPROM cells not within the selected alterable-unit are set to a program inhibit gating voltage level. The program inhibit gating voltage level less a threshold voltage level is applied to the drain of each of the floating gate transistors of the unselected two-transistor FLOTOX EEPROM cells connected commonly to the bit lines and source lines of the selected two-transistor FLOTOX EEPROM cells. The punch-through inhibit voltage level is connected to the source of the floating gate transistor. The drain-to-source voltage of the floating gate transistor is less than the drain-to-source breakdown voltage of the floating gate transistor. The voltage field developed between the control gate and the drain of the floating gate transistor is sufficiently small to prevent initiation of the Fowler-Nordheim tunneling. The punch through inhibit voltage level is approximately one half the very large programming voltage level. The lower drain-to-source voltage level permits the select transistor and the floating gate transistor to have smaller channel lengths and therefore a lower drain-to-source breakdown voltage.

FIG. 4 is a schematic diagram of an embodiment of a portion of an array 200 of two-transistor FLOTOX EEPROM cells 210a, 210b, ..., 210h and 215a, 215b, ..., 215h showing two byte-alterable units 205a and 205b. Referring now to FIG. 4, each of the two-transistor FLOTOX EEPROM cells 210a, 210b, ..., 210h and 215a, 215b, ..., 215h is formed of a select transistor ST and a floating gate transistor FT that is formed and functions as described above in FIGS. 1a, 1b, and 1c. The byte-alterable units 205a and 205b are arranged in two parallel rows. Each of the two-transistor FLOTOX EEPROM cells 210a, 210b, ..., 210h and 215a, 215b, ..., 215h of one byte-alterable units 205a and 205b is paired with one of the two-transistor FLOTOX EEPROM cells 210a, 210b, ..., 210h and 215a, 215b, ..., 215h of the other byte-alterable unit 205a and 205b to form a column. In other embodiments there will be multiple byte-alterable units 205a and 205b that are arranged such that the two-transistor FLOTOX EEPROM cells 210a, 210b, ..., 210h and 215a, 215b, ..., 215h are arranged in rows and columns as is shown in FIG. 5.

The drains of the select transistors ST of the two-transistor FLOTOX EEPROM cells 210a, 210b, ..., 210h and 215a, 215b, ..., 215h are connected to the bit lines BL0, BL1, ..., BL7. The two-transistor FLOTOX EEPROM cells 210a, 210b, ..., 210h and 215a, 215b, ..., 215h that are arranged column-wise are commonly connected to an associated bit line BL0, BL1, ..., BL7. Similarly, the sources of the floating gate transistors ST of the two-transistor FLOTOX EEPROM cells 210a, 210b, ..., 210h and 215a, 215b, ..., 215h are connected to the source lines SL0, SL1, ..., SL7. The two-transistor FLOTOX EEPROM cells 210a, 210b, ..., 210h and 215a, 215b, ..., 215h that are arranged column-wise are commonly connected to an associated source line SL0, SL1, ..., SL7. The associated source lines SL0, SL1, ..., SL7 and the bit lines BL0, BL1, ..., BL7 for each column are placed as metal layers in parallel with its associated column of the two-transistor FLOTOX EEPROM cells 210a, 210b, ..., 210h and 215a, 215b, ..., 215h.

The word line WL0 is connected to the gates of the select transistors ST of the two-transistor FLOTOX EEPROM cells 210a, 210b, ..., 210h of the byte-alterable unit 205a. The word line WL1 is connected to the gates of the select transistors ST of the two-transistor FLOTOX EEPROM cells 215a, 215b, ..., 215h of the byte-alterable unit 205b. Each of the byte-alterable units 205a and 205b further includes a gated bit line select transistor GBLT0 and GBLT1. The gate of the gated bit line select transistor GBLT0 is connected to the word line WL0 and the gate of the gated bit line select transistor GBLT1 is connected to the word line WL1. The drains of the gated bit line select transistor GBLT0 and GBLT1 are connected to the gated bit line BYTEL. The sources of the gated bit line select transistor GBLT0 and GBLT1 are connected to the control gates of the floating gate transistors FT of the respective byte-alterable units 205a and 205b.

Figure 5:
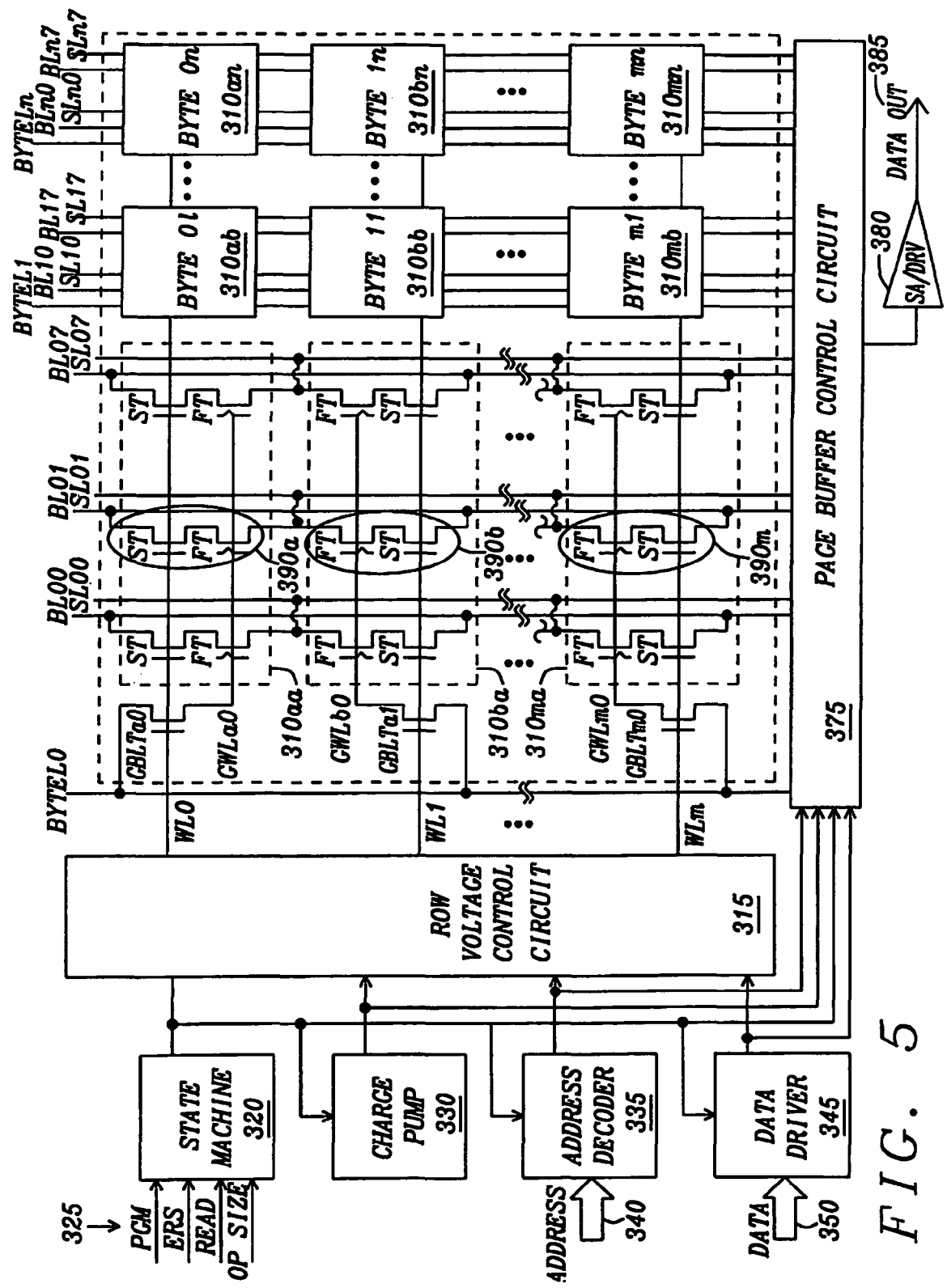
FIG. 5 is schematic diagram of an embodiment of a FLOTOX EEPROM memory device.

FIG. 5 is schematic diagram of a FLOTOX EEPROM memory device 300 that is formed similarly to the two byte-alterable units 205a and 205b of FIG. 4 expanded to an array 305 of any number of byte-alterable units 310aa, 310ab, ..., 310mn. The byte-alterable units 310aa, 310ab, ..., 310mn are arranged such that each of the two-transistor FLOTOX EEPROM cells is ordered in rows and columns.

As described in FIG. 4, each of the byte-alterable units 310aa, 310ab, ..., 310mn have a bit line gating transistor GBTLa0, GBTLa1, ..., GBTLan, ..., GBTLb0, GBTLb1, ..., GBTLbn, ..., GBTLm0, GBTLm1, ..., GBTLmn (not shown) associated with each of the byte-alterable units 310aa, 310ab, ..., 310mn. Each row of the two-transistor FLOTOX EEPROM cells 210a, 210b, ..., 210h and 215a, 215b, ..., 215h of the byte-alterable units 310aa, 310ab, ..., 310mn are connected to a word line WL0, WL1, ..., WLm with the word lines WL0, WL1, ..., WLm connected to the bit line gating transistor GBTLa0, GBTLa1, ..., GBTLan, ..., GBTLb0, GBTLb1, ..., GBTLbn, . . . , GBTLm0, GBTLm1, . . . , GBTLmn and the gates of the select transistors ST of the rows of the two-transistor FLOTOX EEPROM cells of the byte-alterable units 310aa, 310ab, . . . , 310mn. The drain of each of the bit line gating transistors GBTLa0, GBTLa1, . . . , GBTLan, . . . , GBTLb0, GBTLb1, . . . , GBTLbn, . . . , GBTLm0, GBTLm1, . . . , GBTLmn on each column of the byte-alterable units 310aa, 31ab, . . . , 310mn is connected to an associated one of the gated bit lines BYTEL0, BYTEL0, . . . , BYTEL0. The source of the bit line gating transistors GBTLa0, GBTLa1, . . . , GBTLan, . . . , GBTLb0, GBTLb1, . . . , GBTLbn, . . . , GBTLm0, GBTLm1, . . . , GBTLmn are connected respectively to the gated word line GWLa0, GWLa1, . . . , GWLan, . . . , GWLb0, GWLb1, . . . , GWLbn, . . . , GWLm0, GWLm1, . . . , GWLmn. The gated word line GWLa0, GWLa1, . . . , GWLan, . . . , GWLb0, GWLb1, . . . , GWLbn, . . . , GWLm0, GWLm1, . . . , GWLmn are connected to the control gates of the floating gate transistors of the byte-alterable units of the byte-alterable units 310aa, 310ab, . . . , 310mn on the associated row.

The bit lines BL00, BL01, . . . , BL07, BL10, . . . , BL17, . . . , BLn0, . . . , BLn7 are connected to the drains of the select transistors ST of the two-transistor FLOTOX EEPROM cells on the associated column. The source lines SL00, SL01, . . . , SL07, SL10, . . . , SL17, . . . , SLn0, . . . , SLn7 are connected to the sources of the floating gate transistors FT of the two-transistor FLOTOX EEPROM cells on the associated column. As described above, each of the bit lines BL00, BL01, . . . , BL07, BL10, . . . , BL17, . . . , BLn0, . . . , BLn7 and the source lines SL00, SL01, . . . , SL07, SL10, . . . , SL17, . . . , SLn0, . . . , SLn7 are formed as metal lines in parallel with the columns of the two-transistor FLOTOX EEPROM cells.

The bit lines BL0, BL1, . . . , BL7 and the source lines SL0, SL1, . . . , SL7 are connected to the page buffer control circuit 375 to receive the necessary voltage levels for reading, erasing, and programming the selected two-transistor FLOTOX EEPROM cells within chosen byte-alterable units 310aa, 310ab, . . . , 310mn. The word lines WL0, WL1, . . . , WLm are connected to a row voltage control circuit 315 and the row voltage control circuit 315 similarly provides the necessary voltage levels for the reading, erasing, and programming of the selected two-transistor FLOTOX EEPROM cells of the chosen byte-alterable units 310aa, 31ab, . . . , 310mn. A state machine 320 receives the external command signals 325 (program PGM, erase ERS, Read RD, and operation size OP SIZE). The program signal PGM commands the state machine 320 to generate the necessary timing, command, and control signals 355 for programming selected byte-alterable units 310aa, 310ab, . . . , 310mn. The erase signal ERS commands the state machine 320 to generate the necessary timing, command, and control signals 355 for erasing selected byte-alterable units 310aa, 310ab, . . . , 310mn. The read signal RD commands the state machine 320 to generate the necessary timing, command, and control signals 355 for reading selected byte-alterable units 310aa, 310ab, . . . , 310mn. The operation size signal OP SIZE determines the number of byte-alterable units 310aa, 310ab, . . . , 310mn to be programmed, erased, or read. The timing, command, and control signals 355 for the programming, erasing, or reading the selected byte-alterable units 310aa, 310ab, . . . , 310mn are transferred to the row voltage control circuit 315 and the page buffer control circuit 375.

The charge pump 330 receives the timing, command, and control signals 355 and based on the timing, command, and control signals 355 generates the very large programming voltage, the very large erasing voltage, the punch through inhibit programming voltage, the program inhibit gating voltage, and any other voltage levels required that will be larger than the voltage level of the power supply voltage source. The programming, erasing, and reading voltage levels 360 are transferred to the row voltage control circuit 315 and the page buffer control circuit 375 for transfer to the byte-alterable units 310aa, 310ab, . . . , 310mn. The address 340 is the input signals to the address decoder 335. The address decoder 335 decodes the address 340 to provide the necessary selection signals 365 for steering the timing, command, and control signals 355 and programming, erasing, and reading voltage levels 360 to the byte-alterable units 310aa, 310ab, . . . , 310mn.

The data 350 to be written to the array 305 is received by the data driver 345. The data driver 345 conditions the received data 350 and transfers the internal data 370 to the row voltage controller 315 and page buffer control circuit 375. The data state of each bit of the selected byte-alterable units 310aa, 310ab, . . . , 310mn determines whether bits are to be erased and reprogrammed or just erased.

Figure 7A:
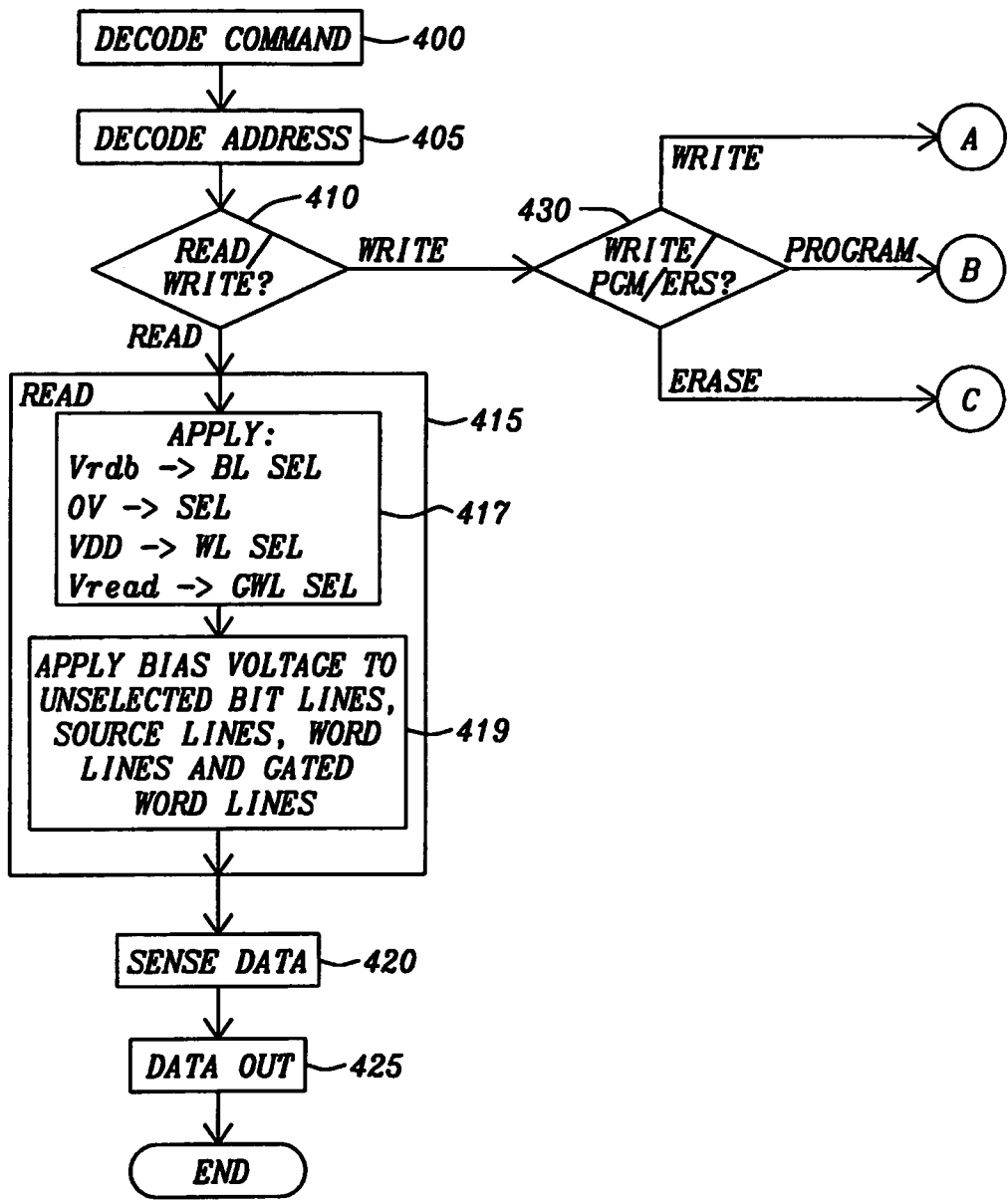

FIGS. 6a, 6b and 6c are tables of the biasing voltages for the reading, erasing, and programming operations the FLOTOX EEPROM memory array 200 of FIG. 4 and the byte-alterable the two-transistor FLOTOX EEPROM memory device 300 of FIG. 5. FIGS. 7a and 7b are a flow chart for operating a FLOTOX EEPROM memory device 300 of FIG. 5. The flow chart of FIGS. 7a and 7b provide a generalized state diagram for the state machine 320 of FIG. 5. The very voltage levels HV and the punch through inhibit programming voltage level HV1 described in FIGS. 6a and 6b provide the erasing and programming biasing voltage levels erasing are generated by the charge pump 330. Refer now to FIGS. 7a and 7b for a description of the operations controlled by the state machine 320 in performing the operations of the FLOTOX EEPROM memory device 300 of FIG. 5. The external command signals 325 (program PGM, erase ERS, Read RD, and operation size OP SZE) are decoded (Box 400) to determine if the operation is a read or write (program and/or erase). The operation size OP SZE may be a byte, multiple bytes, a word, page, or block. The two-transistor FLOTOX EEPROM cells connected to one word line WL0, WL1, . . . , WLm in any one sub-array of the two-transistor FLOTOX EEPROM memory device 300 have the read, write, or program.

The address 340 received by the address decoder 335 is decoded (Box 405). The decoded command is determined (Box 410) if it is a read operation or a write operation. If the decoded command is determined (Box 410) to be a read operation, the read operation is performed (Box 415). The selected byte or selected number of bytes are biased (Box 417) to determine the data stored in the selected byte or selected number of bytes. As shown in the FIG. 6a, the page buffer control circuit 375 applies a read bias voltage level Vrdb to the bit lines BL0, BL1, . . . , BL7 connected to the selected byte or selected number of bytes. The page buffer control circuit 375 applies the ground reference voltage level (0V) to the source lines SL0, SL1, . . . , SL7 connected to the selected byte or selected number of bytes. The row voltage controller 315 applies the voltage level of the power supply voltage source VDD to the word line WL0, WL1, . . . , WLm. The page buffer control circuit 375 applies a read reference voltage level Vread to the gated bit line BYTEL. The selected word line WL0, WL1, . . . , WLm having the voltage level of the power supply source VDD turns on the bit line gating transistor GBTLa0, GBTLa1, . . . , GBTLan, . . . , GBTLb0, GBTLb1, . . . , GBTLbn, . . . , GBTLm0, GBTLm1, . . . , GBTLmn and applies the read reference voltage level Vread to the gated word line GWLa0, GWLa1, . . . , GWLan, . . . , GWLb0, GWLb1, . . . , GWLbn, . . . , GWLm0, GWLm1, . . . , GWLmn. The read reference voltage level Vread has a magnitude that is approximately between a erased threshold voltage level (Vt1) and a programmed threshold voltage level (Vt0).

The unselected bytes are biased (Box 419) to prevent the unselected bytes from corrupting the sensing of the data from the selected two-transistor FLOTOX EEPROM cells. As shown in the FIG. 6b for the two-transistor FLOTOX EEPROM cells on the same column as the selected byte or bytes, the page buffer control circuit 375 applies a read bias voltage level Vrdb to the bit lines BL0, BL1, . . . , BL7 connected to the selected byte or selected bytes. The page buffer control circuit 375 applies the ground reference voltage level (0V) to the source lines SL0, SL1, . . . , SL7 connected to the selected byte or selected bytes. The row voltage controller 315 applies the ground reference voltage level (0V) to the word lines WL0, WL1, . . . , WLm connected to the unselected bytes. The page buffer control circuit 375 applies a read reference voltage level Vread to the gated bit line BYTEL. The unselected word line WL0, WL1, . . . , WLm having the ground reference voltage level turns off the bit line gating transistors GBTLa0, GBTLa1, . . . , GBTLan, . . . , GBTLb0, GBTLb1, . . . , GBTLbn, . . . , GBTLm0, GBTLm1, . . . , GBTLmn connected to the unselected bytes and disconnects the gated word lines GWLa0, GWLa1, . . . , GWLan, . . . , GWLb0, GWLb1, . . . , GWLbn, . . . , GWLm0, GWLm1, . . . , GWLmn connected to the unselected bytes on the same column such that they float.

In the FIG. 6c for the two-transistor FLOTOX EEPROM cells on the same row as the selected byte or bytes, the page buffer control circuit 375 applies the ground reference voltage level (0V) to the bit lines BL0, BL1, . . . , BL7 and the source lines SL0, SL1, . . . , SL7 connected to the unselected bytes. The row voltage controller 315 applies the voltage level of the power supply voltage source VDD to the word line WL0, WL1, . . . , WLm connected to the unselected bytes. The page buffer control circuit 375 applies the ground reference voltage level to the gated bit line BYTEL. The selected word line WL0, WL1, . . . , WLm having the voltage level of the power supply source VDD turns on the bit line gating transistor GBTLa0, GBTLa1, . . . , GBTLan, . . . , GBTLb0, GBTLb1, . . . , GBTLbn, . . . , GBTLm0, GBTLm1, . . . , GBTLmn and applies the ground reference voltage level to the gated word line GWLa0, GWLa1, . . . , GWLan, . . . , GWLb0, GWLb1, . . . , GWLbn, . . . , GWLm0, GWLm1, . . . , GWLmn of the unselected bytes on the same row.

The selected two-transistor FLOTOX EEPROM cells turn-on or remain turned-off and the sense amplifier 380 senses (Box 420) the data stored in the selected two-transistor FLOTOX EEPROM cells. The data is conditioned and driven (Box 425) external circuitry and the read operation is completed.

A write operation may be either a two-step operation where a selected byte or number of bytes (page, block, sector, or chip) are erased and then programmed. Each array 305 or sub-array generally (but not necessarily exclusively) has one page buffer 375. Therefore, a program operation of segments of array 305 of the two-transistor FLOTOX EEPROM cells larger than the page must be performed iteratively. If the decoded command is determined (Box 410) to be a write operation, the write operation is determined (Box 430) to be a complete write, a program operation of a previously erased array 305 or sub-array, or an erase operation of segments of the array 305 of the two-transistor FLOTOX EEPROM cells.

If the operation is determined (Box 430) to be a write or an erase, the selected byte or bytes are erased (Box 435). In the erasing (Box 435), the selected byte or bytes, as shown in the FIG. 6a, are erased (Box 436) by the page buffer control circuit 375 applying the ground reference voltage (0V) to the bit lines BL0, BL1, . . . , BL7 and the source lines SL0, SL1, . . . , SL7 connected to the selected byte or selected number of bytes. The row voltage controller 315 applies the very large erasing voltage level HV to the word line WL0, WL1, . . . , WLm. The page buffer control circuit 375 applies a very large erase voltage level HV to the gated bit line BYTEL. The selected word line WL0, WL1, . . . , WLm having the very large erasing voltage level HV applied to it turns on the bit line gating transistor GBTLa0, GBTLa1, . . . , GBTLan, . . . , GBTLb0, GBTLb1, . . . , GBTLbn, . . . , GBTLm0, GBTLm1, . . . , GBTLmn and applies the very large erasing voltage level HV less a transistor threshold voltage Vt to the gated word line GWLa0, GWLa1, . . . , GWLan, . . . , GWLb0, GWLb1, . . . , GWLbn, . . . , GWLm0, GWLm1, . . . , GWLmn. The very large erase voltage level HV has a magnitude that is from approximately 15V to approximately 17V.

The unselected bytes are biased to prevent (Box 437) erase disturbance of the two-transistor FLOTOX EEPROM cells of the unselected bytes. As shown in the FIG. 6b for the two-transistor FLOTOX EEPROM cells on the same column as the selected byte or bytes, the page buffer control circuit 375 applies the ground voltage reference level to the bit lines BL0, BL1, . . . , BL7 and the source lines SL0, SL1, . . . , SL7 connected to the selected byte or selected bytes. The row voltage controller 315 applies the ground reference voltage level (0V) to the word lines WL0, WL1, . . . , WLm connected to the unselected byte or bytes. The page buffer control circuit 375 applies a very large erase voltage level HV to the gated bit line BYTEL. The unselected word line WL0, WL1, . . . , WLm having the ground reference voltage level turns off the bit line gating transistors GBTLa0, GBTLa1, . . . , GBTLan, . . . , GBTLb0, GBTLb1, . . . , GBTLbn, . . . , GBTLm0, GBTLm1, . . . , GBTLmn connected to the unselected bytes on the same column and disconnects the gated word lines GWLa0, GWLa1, . . . , GWLan, . . . , GWLb0, GWLb1, . . . , GWLbn, . . . , GWLm0, GWLm1, . . . , GWLmn connected to the unselected bytes on the same column, to allow them to float.

In the FIG. 6c for the two-transistor FLOTOX EEPROM cells on the same row as the selected byte or bytes, applies the ground reference voltage level (0V) to the bit lines BL0, BL1, . . . , BL7 and the source lines SL0, SL1, . . . , SL7 connected to the unselected bytes. The row voltage controller 315 applies the very large erasing voltage level HV to the word line WL0, WL1, . . . , WLm connected to the unselected bytes. The page buffer control circuit 375 applies the ground reference voltage level to the gated bit line BYTEL. The selected word line WL0, WL1, . . . , WLm having the voltage level of the very large erasing voltage HV turns on the bit line gating transistor GBTLa0, GBTLa1, . . . , GBTLan, . . . , GBTLb0, GBTLb1, . . . , GBTLbn, . . . , GBTLm0, GBTLm1, . . . , GBTLmn and applies the ground reference voltage level to the gated word line GWLa0, GWLa1, . . . , GWLan, . . . , GWLb0, GWLb1, . . . , GWLbn, . . . , GWLm0, GWLm1, . . . , GWLmn of the unselected bytes on the same row.

During the erase operation (Box 435), the electrons in the channel region between drain and source nodes of the floating gate transistors FT of the selected byte or bytes are injected to the floating-gate of FT storage device. After a predetermined time of greater than 500 µs, the floating-gate of the floating gate transistor FT of the selected byte or bytes is filled with the injected electrons. As a result, the threshold voltage Vt of the floating gate transistor FT of the selected bytes or bytes is increased above the erased threshold voltage level Vt1 of approximately +1.0V. The high threshold voltage Vt1 is designated as having stored binary "0" data.

The selected byte or bytes are then erase verified (Box 438). If the selected byte or bytes have not been verified (Box 438) as erased, the number of erase operations are compared (Box 439) to a maximum erase count. If the number erase operations are less than the maximum erase count, the byte or bytes are re-erased (Box 436) and erased verified (Box 438). The number of erase operations are compared (Box 439) to a maximum erase count. If the number erase operations are greater than the maximum erase count, an error is declared and the erase operation is ended. If the selected byte or bytes have been verified (Box 438) as erased, the operation is determined (Box 439) if it is a write operation or an erase operation. If the operation is an erase, the operation is ended.

If the operation is a write or program operation, the selected byte or bytes are programmed (Box 445). In the programming (Box 445), the selected byte or bytes, as shown in the FIG. 6a, are programmed (Box 446) by the page buffer control circuit 375 applying the very large programming voltage HV to the bit lines BL0, BL1, . . . , BL7. The page buffer control circuit 375 applies the punch through inhibit programming voltage HV1 the source lines SL0, SL1, . . . , SL7 connected to the selected byte or bytes. The row voltage controller 315 applies very large programming voltage HV to the word line WL0, WL1, . . . , WLm connected to the selected bytes or bytes. The page buffer control circuit 375 applies the ground reference voltage level to the gated bit line BYTEL. The selected word line WL0, WL1, . . . , WLm having the very large programming voltage HV turns on the select transistors SL such that the very large programming voltage HV is transferred to the merged N+ source/drain of the select transistor ST and the floating gate transistor FT. The very large programming voltage HV causes the electrons to be ejected from the floating gate of the floating gate transistor FT. The selected word line WL0, WL1, . . . , WLm having the very large programming voltage HV turns on the bit line gating transistor GBTLa0, GBTLa1, . . . , GBTLan, . . . , GBTLb0, GBTLb1, . . . , GBTLbn, . . . , GBTLm0, GBTLm1, . . . , GBTLmn and applies the ground reference voltage level to the gated word line GWLa0, GWLa1, . . . , GWLan, . . . , GWLb0, GWLb1, . . . , GWLbn, . . . , GWLm0, GWLm1, . . . , GWLmn. The very large program voltage level HV has a magnitude that is from approximately 15V to approximately 17V. The punch through inhibit programming voltage has a magnitude of from approximately 6V to approximately 8V The unselected bytes are biased (Box 447) to prevent program disturbance of the two-transistor FLOTOX EEPROM cells of the unselected bytes. As shown in the FIG. 6b for the two-transistor FLOTOX EEPROM cells on the same column as the selected byte or bytes, the page buffer control circuit 375 applies the very large programming voltage HV to the bit lines BL0, BL1, . . . , BL7. The page buffer control circuit 375 applies the punch through inhibit programming voltage HV1 the source lines SL0, SL1, . . . , SL7 connected to the selected byte or bytes. The row voltage controller 315 applies a program inhibit gating voltage Vgate to the word lines WL0, WL1, . . . , WLm connected to the unselected bytes of the column or columns having the selected bytes or bytes. The program inhibit gating voltage Vgate is approximately one-half the very large programming voltage HV or a magnitude of from approximately 3V to approximately 5V. The page buffer control circuit 375 applies ground reference voltage to the gated bit line BYTEL. The unselected word line WL0, WL1, . . . , WLm having the voltage level of the program inhibit gating voltage turns on the bit line gating transistors GBTLa0, GBTLa1, . . . , GBTLan, . . . , GBTLb0, GBTLb1, . . . , GBTLbn, . . . , GBTLm0, GBTLm1, . . . , GBTLmn connected to the unselected bytes on the same column and applies the program inhibit gating voltage Vgate less a transistor threshold voltage Vt to the gated word lines GWLa0, GWLa1, . . . , GWLan, . . . , GWLb0, GWLb1, . . . , GWLbn, . . . , GWLm0, GWLm1, . . . , GWLmn connected to the unselected bytes.

In the FIG. 6c for the two-transistor FLOTOX EEPROM cells on the same row as the selected byte or bytes, applies the ground reference voltage level (0V) to the bit lines BL0, BL1, . . . , BL7 and the source lines SL0, SL1, . . . , SL7 connected to the unselected bytes. The row voltage controller 315 applies the very large programming voltage level HV to the word line WL0, WL1, . . . , WLm connected to the unselected bytes. The page buffer control circuit 375 applies the ground reference voltage level to the gated bit line BYTEL. The selected word line WL0, WL1, . . . , WLm having the voltage level of the very large erasing voltage HV turns on the bit line gating transistor GBTLa0, GBTLa1, . . . , GBTLan, . . . , GBTLb0, GBTLb1, . . . , GBTLbn, . . . , GBTLm0, GBTLm1, . . . , GBTLmn and applies the ground reference voltage level to the gated word line GWLa0, GWLa1, . . . , GWLan, . . . , GWLb0, GWLb1, . . . , GWLbn, . . . , GWLm0, GWLm1, . . . , GWLmn of the unselected bytes on the same row.

If for example, the selected cell 390a to be programmed is connected to the bit line BL01 and the source line SL01, and the word line WL0. The selected word line WL0 and the selected bit line BL01 have the very large programming voltage HV applied to it. The selected source line SL01 has the punch through inhibit program voltage level HV1 applied to it. The unselected word lines WL1, . . . , WLn have the program inhibit gating voltage Vgate applied to them. The unselected bit lines BL00, BL02, . . . , BL07, BL10, . . . , BL17, . . . , BLn7, BLn0, . . . , BLn7 have the ground reference voltage (0V) applied to them. The select transistors ST of the unselected FLOTOX EEPROM cells 390b, . . . , 390m on the column with the selected FLOTOX EEPROM cell 390a are set to the program inhibit gating voltage Vgate (3-5V). The gated word lines GWL1, . . . , GWLn connected to the floating gate transistors FT unselected of the unselected FLOTOX EEPROM cells 390b, . . . , 390m on the column with the selected FLOTOX EEPROM cell 390a are set to the ground reference voltage level (0V). With the gate of the select transistors ST of the unselected FLOTOX EEPROM cells 390b, . . . , 390m on the same column as the selected FLOTOX EEPROM cell 390a set to the program inhibit gating voltage level Vgate (3-5 v), the voltage at the drain of the floating gate transistors FT of the unselected cells 390b, . . . , 390m of the column is set to the voltage level of the program inhibit gating voltage level Vgate less a threshold voltage level Vt of the select transistors ST. The sources of the floating gate transistors FT on the same column are set to the punch through inhibit program voltage level HV1. This sets the channel voltage level less than the voltage sufficient to trigger the Fowler-Nordheim tunneling and drain-to-source voltage Vds of the floating gate transistors FT of the unselected FLOTOX EEPROM cells 390b, . . . , 390m is less than the drain-to-source breakdown voltage BVDS of the floating gate transistors FT.

During the program operation (Box 445), the electrons in the channel region between drain and source nodes of the floating gate transistors FT of the selected byte or bytes are ejected to the floating-gate of FT storage device. After a predetermined time of greater than 500 μs, the floating-gate of the floating gate transistor FT of the selected byte or bytes is emptied of its electrons. As a result, the threshold voltage Vt of the floating gate transistor FT of the selected bytes or bytes is decreased to less than the programmed threshold voltage level Vt0 of approximately −1.0V. The high threshold voltage Vt0 is designated as having stored binary "1" data.

The selected byte or bytes are then program verified (Box 448). If the selected byte or bytes have not been verified (Box 448) as programmed, the number of program operations are compared (Box 449) to a maximum program count. If the number program operations are less than the maximum program count, the byte or bytes are re-programmed (Box 446) and programmed verified (Box 448). The number of program operations are compared (Box 449) to a maximum program count. If the number program operations are greater than the maximum program count, an error is declared and the program operation is ended. If the selected byte or bytes have been verified (Box 448) as programmed, the operation is ended.

The structure of the array 305 of FIG. 5 is such that the sources of each of the floating gate transistors FT of each of the two-transistor FLOTOX EEPROM cells on each column are segregated from the sources of the floating gate transistors FT of the two-transistor FLOTOX EEPROM cells the other columns. Thus each column of the two-transistor FLOTOX EEPROM cells has a common source line SL0, SL1, . . . , SL7. This permits the source line or source lines SL0, SL1, . . . , SL7 connected to the selected byte or bytes that have the two-transistor FLOTOX EEPROM cell(s) 390a that are to be programmed to be set to the punch through inhibit programming voltage HV1. The very large programming voltage HV is applied to the bit line of each of the two-transistor FLOTOX EEPROM cell(s) 390a of the selected byte or bytes that are to be programmed.

From the discussion of FIG. 1c, the two-transistor FLOTOX EEPROM cell are essentially a three transistor device with the select transistors ST1 and ST2 being structured on each side of the floating gate charge storage device to prevent high voltage disturbance or punch-through of the floating gate charge storage device FGD during the program operation. The select transistors ST1 and ST2 each have relatively thick gate oxide regions 35 and 55. In the prior art with the source lines SL commonly connected ground reference voltage level, the very large programming voltage HV present at the drain of the first select transistor ST1 and thus to the merged N+ source/drain 20 of the select transistor ST and the floating gate transistor FT. The select transistor ST2 is turned off and the voltage across the channel of the select transistor ST2 is essentially the voltage level of the very large programming voltage HV. This essentially determines the minimum size of the floating gate transistors FT since the channel length has to be sufficiently large to prevent drain-to-source punch-through. In various embodiments of the present invention, having the segregated source lines SL0, SL1, . . . , SL7 (of FIG. 5) allows the source lines SL0, SL1, . . . , SL7 connected to the two-transistor FLOTOX EEPROM cells that are to be programmed to be set to the punch through inhibit programming voltage HV1 to decrease the drain-to-source voltage $V_{DS}$. This allows the drain-to-source breakdown voltage $BV_{DS}$ to be smaller and thus the channel length of the floating gate transistors FT to be smaller. Further, the select transistors ST of the unselected two-transistor FLOTOX EEPROM cells 390b, . . . , 390m that are connected to the bit line BL1 and source line SL1 of the selected two-transistor FLOTOX EEPROM cell(s) 390a are turned off. With the bit line BL1 of the selected two-transistor FLOTOX EEPROM cell(s) 390a set to the very large programming voltage HV and source line SL1 of the selected two-transistor FLOTOX EEPROM cell(s) 390a being set to the punch through inhibit programming voltage HV1, the voltage developed between the source and drain of the select transistors ST of the unselected two-transistor FLOTOX EEPROM cells 390b, . . . , 390m is sufficiently small that the drain-to-source breakdown voltage $BV_{DS}$ may be made smaller. With the drain-to-source breakdown voltage $BV_{DS}$ being smaller the channel length may now be shorter and thus the size of the two-transistor FLOTOX EEPROM cells of the array 305 may be smaller.

In the prior art, having the very large programming voltage HV developed between the source and drain of the select transistors ST1 and ST2, the channel length has to be larger than 1.0 μm typically at semiconductor processing technology have 0.13 μm or 0.18 μm feature sizes. In the embodiments of the present invention, as shown, the channel length of the select transistors ST1 and ST2 may be 0.5 μm or less. If the channel length is sufficiently small or the very large programming voltage HV is too great, the drain-to-source voltage $V_{DS}$ may be some what greater than the drain-to-source breakdown voltage $BV_{DS}$. Punch-through may occur and the unselected two-transistor FLOTOX EEPROM cells 390b, . . . , 390m may have a leakage current to the source line SL1. The leakage current will be self-inhibiting since each bit line BL00, BL02, . . . , BL07, BL10, . . . , BL17, . . . , BLn7, BLn0, . . . , BLn7 has its own dedicated source line SL00, SL01, . . . , SL07, SL10, . . . , SL17, . . . , SLn0, . . . , SLn7. There will be no high voltage leakage current from any one bit line BL00, BL02, . . . , BL07, BL10, . . . , BL17, . . . , BLn7, BLn0, . . . , BLn7 to another bit line BL00, BL02, . . . , BL07, BL10, . . . , BL17, . . . , BLn7, BLn0, . . . , BLn7 in the selected byte or bytes as may happen in an array of the two-transistor FLOTOX EEPROM cells of the prior art. Further, the reduced drain-to-source voltage in the floating gate transistors FT of the selected two-transistor FLOTOX EEPROM cell(s) 390a and select transistors ST of the unselected two-transistor FLOTOX EEPROM cells 390b, . . . , 390m and the segregated source lines SL00, SL01, . . . , SL07, SL10, . . . , SL17, . . . , SLn0, . . . , SLn7 for each column provide a much more reliable high voltage program operation. The program yield for the two-transistor FLOTOX EEPROM device 300 can be enhanced and guaranteed when process technology migrates to a smaller geometry.

While this invention has been particularly shown and described with reference to the preferred embodiments thereof, it will be understood by those skilled in the art that various changes in form and details may be made without departing from the spirit and scope of the invention.

The invention claimed is:

1. A two-transistor FLOTOX EEPROM cell that prevents punch-through and high voltage disturbances during cell programming comprising:
   a select transistor having a drain connected to a bit line and a gate connected to a word line; and
   a floating gate thin oxide transistor having a drain merged with a source of the select transistor, a source connected to a source line, and a gate connected to a gated word line;
   wherein the bit line and the source line are parallel and the bit line and the source line are perpendicular to the word line and the gated word line;
   wherein, during a programming operation of an associated selected two-transistor FLOTOX EEPROM cell, in which the two-transistor FLOTOX EEPROM cell is not selected, a very large programming voltage is applied to the bit line and a punch through inhibit programming voltage is applied to the source line such that a drain-to-source voltage of the select transistor and the floating gate thin oxide transistor is less than a drain-to-source breakdown voltage of the select transistor and the floating gate thin oxide transistor.

2. The two-transistor FLOTOX EEPROM cell of claim 1 wherein the bit line and the source line are metal lines placed in parallel.

3. The two-transistor FLOTOX EEPROM cell of claim 1 wherein the punch through inhibit programming voltage has a magnitude that is approximately one-half a magnitude of the very large programming voltage.

4. The two-transistor FLOTOX EEPROM cell of claim 1 wherein the very large programming voltage has a magnitude of from approximately 15V to approximately 17V and the very large programming voltage has a magnitude of from approximately 6V to approximately 8V.

5. The two-transistor FLOTOX EEPROM cell of claim 1 wherein the programming operation is greater than 500 μs.

6. A two-transistor FLOTOX EEPROM array comprising:
   a matrix of a plurality of two-transistor FLOTOX EEPROM cells arranged in rows and columns, wherein each two-transistor FLOTOX EEPROM cell comprises:
      a select transistor, and
      a floating gate thin oxide transistor having a drain merged with a source of the select transistor;
   a plurality of bit lines, each bit line associated with one column of the two-transistor FLOTOX EEPROM cells such that each bit line is connected to the drains of the two-transistor FLOTOX EEPROM cells of the associated column;
   a plurality of source lines, each source line associated with one column of the two-transistor FLOTOX EEPROM cells and parallel with the bit line associated with the column of two-transistor FLOTOX EEPROM cells and connected to a source of the floating gate thin oxide transistor;
   a plurality of word lines, each word line associated with one row of the two-transistor FLOTOX EEPROM cells and connected to the gates of the select transistors of the associated row of two-transistor FLOTOX EEPROM cells and perpendicular to the bit lines and the source lines;
   a gated bit line associated with a plurality of alterable units of the two-transistor FLOTOX EEPROM cells; and
   a plurality of gated bit line transistors, each gated bit line transistor associated with one alterable unit of two-transistor FLOTOX EEPROM cells, wherein each gated bit line transistor has a drain connected to the gated bit line associated with the alterable unit of two-transistor FLOTOX EEPROM cells, a source connected to a gated word line that is connected to a control gate of the floating gate thin oxide transistor of each of the two-transistor FLOTOX EEPROM cells in each of the alterable unit of the two-transistor FLOTOX EEPROM cells, and a gate connected to the word line associated with the row of the alterable unit of the two-transistor FLOTOX EEPROM cells;
   wherein, during a programming operation of selected two-transistor FLOTOX EEPROM cells, a very large programming voltage is applied to the bit lines and the word lines associated with the selected two-transistor FLOTOX EEPROM cells and a punch through inhibit programming voltage is applied to the source lines associated with the selected two-transistor FLOTOX EEPROM cells to decrease a drain-to-source voltage of the select transistor and the floating gate thin oxide transistor.

7. The two-transistor FLOTOX EEPROM array of claim 6 wherein the alterable unit of the two-transistor FLOTOX EEPROM cells is a nibble (4 bits), a byte, a half-word (16 bits), a word, or any number of two-transistor FLOTOX EEPROM cells.

8. The two-transistor FLOTOX EEPROM array of claim 6 wherein at least one selected alterable-unit of two-transistor FLOTOX EEPROM cells is erased by:
   applying a ground reference voltage level (0V) to the bit line and thus to the drain of the select transistor of each of the two-transistor FLOTOX EEPROM cells of the alterable-unit;
   applying the ground reference voltage level (0V) to the source line and thus to the source of the floating gate transistor of each of the two-transistor FLOTOX EEPROM cells of the alterable-unit;
   applying a voltage level of the power supply voltage source to the word line; and
   applying a very large erasing voltage to the gating bit line and thus to the very large erasing voltage is applied to each of the control gates of the floating gate transistors.

9. The two-transistor FLOTOX EEPROM array of claim 8 wherein the very large erasing voltage causes a voltage field between the floating gate and the channel of the floating gate transistors through a thin oxide to initiate a Fowler-Nordheim tunneling to erase the two-transistor FLOTOX EEPROM cells and wherein the very large erasing voltage has a magnitude of from approximately 15V to approximately 17V.

10. The two-transistor FLOTOX EEPROM array of claim 8 wherein at least one unselected alterable-unit of two-transistor FLOTOX EEPROM cells is inhibited from being erased by:
   applying a ground reference voltage level (0V) to the bit line and thus to the drain of the select transistor of each of the two-transistor FLOTOX EEPROM cells of the at least one unselected alterable-unit;
   applying the ground reference voltage level (0V) to the source line and thus to the source of the floating gate transistor of each of the two-transistor FLOTOX EEPROM cells of the at least one unselected alterable-unit; ground reference voltage level to the word line and the gated bit line.

11. The two-transistor FLOTOX EEPROM array of claim 6 wherein at least one FLOTOX EEPROM cell within a selected alterable-unit of two-transistor FLOTOX EEPROM cells is programmed by:
   applying a very large programming voltage to the bit line and thus to the drain of the select transistor of the at least one programmed two-transistor FLOTOX EEPROM cell of the selected alterable-unit;
   applying a punch-through inhibit programming voltage to the source line and thus to the source of the floating gate transistor of the at least one programmed two-transistor FLOTOX EEPROM cell of the selected alterable-unit;
   applying the very large programming voltage to the word line; and
   applying the ground reference voltage level to the gating bit line and through the bit line gating transistor to the gated word lines and thus the control gates of the floating gate transistors are connected to the ground reference voltage level in some embodiments.

12. The two-transistor FLOTOX EEPROM array of claim 6 wherein the unselected two-transistor FLOTOX EEPROM cells on the same column as the at least one two-transistor FLOTOX EEPROM cells selected for programming are inhibited from being programmed by:
  applying the very large programming voltage to the bit line and thus to the drain of the select transistor of each of the two-transistor FLOTOX EEPROM cells of the alterable-unit;
  applying the punch-through inhibit programming voltage to the source line and thus to the source of the floating gate transistor of each of the two-transistor FLOTOX EEPROM cells on the same column as the at least one programmed two-transistor FLOTOX EEPROM cell;
  applying a program inhibit gating voltage level to the word line that is sufficient to turn on the select transistor to set the channel voltage to a threshold voltage level less than the very large programming voltage level; and
  applying the ground reference voltage level to the gated bit line and thus to the gated word line;
  wherein the program inhibit gating voltage level less the threshold voltage level of the select transistor is placed at the drain of the floating gate transistor and the punch-through inhibit programming voltage is placed at the source of the floating gate transistor to provide a drain-to-source voltage level of the select transistor and the floating gate transistor less than the drain-to-source breakdown voltage level of the select transistor and the floating gate transistor of each of the unselected two-transistor FLOTOX EEPROM cells on the same column as the programmed at least one two-transistor FLOTOX EEPROM cell of the selected alterable-unit.

13. The two-transistor FLOTOX EEPROM array of claim 6 wherein unselected two-transistor FLOTOX EEPROM cells not on the same column or columns of the at least one programmed two-transistor FLOTOX EEPROM cell of the selected alterable-unit of two-transistor FLOTOX EEPROM cells are inhibited from programming by:
  applying the ground reference voltage level to the bit lines and source lines connected to the unselected alterable-unit of two-transistor FLOTOX EEPROM cells inhibit formation of a voltage field between the channel of the floating gate transistors and the floating gate through the thin oxide and thus initiation of the Fowler-Nordheim tunneling and programming the unselected two-transistor FLOTOX EEPROM cells.

14. The two-transistor FLOTOX EEPROM array of claim 6 wherein the very large programming voltage has a magnitude of from approximately 15V to approximately 17V.

15. The two-transistor FLOTOX EEPROM array of claim 6 wherein the punch through inhibit programming voltage is approximately one-half the very large programming voltage.

16. The two-transistor FLOTOX EEPROM array of claim 15 wherein the punch through inhibit programming voltage is from approximately 6V to approximately 8V.

17. The two-transistor FLOTOX EEPROM array of claim 12 wherein the program inhibit gating voltage level is from approximately 3V to approximately 5V.

18. The two-transistor FLOTOX EEPROM array of claim 6 wherein the programming operation is greater than 500 μs.

19. The two-transistor FLOTOX EEPROM array of claim 6 wherein the alterable-unit of two-transistor FLOTOX EEPROM cells is read by:
  applying a read biasing voltage to the bit line and thus to the drain of the select transistor of each of the two-transistor FLOTOX EEPROM cells of the alterable-unit;
  applying the ground reference voltage level to the source line and thus to the source of the floating gate transistor of each of the two-transistor FLOTOX EEPROM cells of the alterable-unit;
  applying the voltage level of the power supply voltage source is applied to the word line;
  applying a read reference voltage level to the gating bit line and thus to the control gates of the floating gate transistors are connected to the read reference voltage level; and
  detecting a program state of the selected two-transistor FLOTOX EEPROM cells by a sense amplifier connected to the source line.

20. The two-transistor FLOTOX EEPROM array of claim 19 wherein an unselected alterable-unit of two-transistor FLOTOX EEPROM cells is inhibited from being read by:
  applying a read biasing voltage to the bit line and thus to the drain of the select transistor of each of the two-transistor FLOTOX EEPROM cells of the alterable-unit;
  applying the ground reference voltage level to the source line and thus to the source of the floating gate transistor of each of the two-transistor FLOTOX EEPROM cells of the alterable-unit;
  applying the voltage level of the power supply voltage source to the word line;
  applying the ground reference voltage level to the gating bit line and thus the control gates of the floating gate transistors that are connected to the ground reference voltage level to insure that the unselected two-transistor FLOTOX EEPROM cells are inhibited from being read.

21. The FLOTOX EEPROM device of claim 6 wherein the source lines and bit lines associated with each column of two-transistor FLOTOX EEPROM cells comprises metal bit lines and metal source lines placed in parallel with the associated column of two-transistor FLOTOX EEPROM cells.

22. A FLOTOX EEPROM device comprising:
  a two-transistor FLOTOX EEPROM array comprising:
    a matrix of a plurality of two-transistor FLOTOX EEPROM cells arranged in rows and columns, wherein each two-transistor FLOTOX EEPROM cell comprises:
      a select transistor, and
      a floating gate thin oxide transistor having a drain merged with a source of the select transistor;
    a plurality of bit lines, each bit line associated with one column of the two-transistor FLOTOX EEPROM cells such that each bit line is connected to the drains of the two-transistor FLOTOX EEPROM cells of the associated column;
    a plurality of source lines, each source line associated with one column of the two-transistor FLOTOX EEPROM cells and parallel with the bit line associated with the column of two-transistor FLOTOX EEPROM cells and connected to a source of the floating gate thin oxide transistor;
    a plurality of word lines, each word line associated with one row of the two-transistor FLOTOX EEPROM cells and connected to the gates of the select transistors of the associated row of two-transistor FLOTOX EEPROM cells and perpendicular to the bit lines and the source lines;
    a gated bit line associated with a plurality of alterable units of the two-transistor FLOTOX EEPROM cells;
    a plurality of gated bit line transistors, each gated bit line transistor associated with one alterable unit of two-transistor FLOTOX EEPROM cells, wherein each gated bit line transistor has a drain connected to the gated bit line associated with the alterable unit of two-transistor FLOTOX EEPROM cells, a source connected to a gated word line that is connected to a control gate of the floating gate thin oxide transistor of each of the two-transistor FLOTOX EEPROM cells in each of the alterable unit of the two-transistor FLOTOX EEPROM cells, and a gate connected to the word line associated with the row of the alterable unit of the two-transistor FLOTOX EEPROM cells;

a row voltage control circuit connected to the word lines of the two-transistor FLOTOX EEPROM array to transfer control voltages to the word lines for reading and writing the two-transistor FLOTOX EEPROM cells; and a page buffer control circuit connected to the bit lines, the source lines, and the gated bit lines of the two-transistor FLOTOX EEPROM array to transfer the control voltages to the word lines for reading and writing the two-transistor FLOTOX EEPROM cells;

wherein, during a programming operation of selected two-transistor FLOTOX EEPROM cells, the page buffer control circuit transfers a very large programming voltage through the bit lines to the drains of the select transistors of the selected two-transistor FLOTOX EEPROM cells and the page buffer control circuit transfers a punch through inhibit programming voltage through the source lines to the sources of the floating gate thin oxide transistor of the same columns of the selected two-transistor FLOTOX EEPROM cells to decrease a drain-to-source voltage of the select transistor and the floating gate thin oxide transistor.

23. The FLOTOX EEPROM device of claim 22 wherein the alterable unit of the two-transistor FLOTOX EEPROM cells is a nibble (4 bits), a byte, a half-word (16 bits), a word, or any number of two-transistor FLOTOX EEPROM cells.

24. The FLOTOX EEPROM device of claim 22 wherein at least one selected alterable-unit of two-transistor FLOTOX EEPROM cells is erased by:
the page buffer control circuit applying a ground reference voltage level (0V) to the bit line and thus to the drain of the select transistor of each of the two-transistor FLOTOX EEPROM cells of the alterable-unit;
the page buffer control circuit applying the ground reference voltage level (0V) to the source line and thus to the source of the floating gate transistor of each of the two-transistor FLOTOX EEPROM cells of the alterable-unit;
the row voltage control circuit applying a voltage level of the power supply voltage source to the word line; and
the page buffer control circuit applying a very large erasing voltage to the gating bit line and thus to the very large erasing voltage is applied to each of the control gates of the floating gate transistors.

25. The FLOTOX EEPROM device of claim 24 wherein the very large erasing voltage causes a voltage field between the floating gate and the channel of the floating gate transistors through a thin oxide to initiate a Fowler-Nordheim tunneling to erase the two-transistor FLOTOX EEPROM cells and wherein the very large erasing voltage has a magnitude of from approximately 15V to approximately 17V.

26. The FLOTOX EEPROM device of claim 22 wherein at least one unselected alterable-unit of two-transistor FLOTOX EEPROM cells is inhibited from being erased by:
the page buffer control circuit applying a ground reference voltage level (0V) to the bit line and thus to the drain of the select transistor of each of the two-transistor FLOTOX EEPROM cells of the at least one unselected alterable-unit;
the page buffer control circuit applying the ground reference voltage level (0V) to the source line and thus to the source of the floating gate transistor of each of the two-transistor FLOTOX EEPROM cells of the at least one unselected alterable-unit; ground reference voltage level to the word line and the gated bit line.

27. The FLOTOX EEPROM device of claim 22 wherein at least one FLOTOX EEPROM cell within a selected alterable-unit of two-transistor FLOTOX EEPROM cells is programmed by:
the page buffer control circuit applying a very large programming voltage to the bit line and thus to the drain of the select transistor of the at least one programmed two-transistor FLOTOX EEPROM cell of the selected alterable-unit;
the page buffer control circuit applying a punch-through inhibit programming voltage to the source line and thus to the source of the floating gate transistor of the at least one programmed two-transistor FLOTOX EEPROM cell of the selected alterable-unit;
the row voltage control circuit applying the very large programming voltage to the word line; and
the page buffer control circuit applying the ground reference voltage level to the gating bit line and through the bit line gating transistor to the gated word lines and thus the control gates of the floating gate transistors are connected to the ground reference voltage level in some embodiments.

28. The FLOTOX EEPROM device of claim 22 wherein the unselected two-transistor FLOTOX EEPROM cells on the same column as the at least one two-transistor FLOTOX EEPROM cells selected for programming are inhibited from being programmed by:
the page buffer control circuit applying the very large programming voltage to the bit line and thus to the drain of the select transistor of each of the two-transistor FLOTOX EEPROM cells of the alterable-unit;
the page buffer control circuit applying the punch-through inhibit programming voltage to the source line and thus to the source of the floating gate transistor of each of the two-transistor FLOTOX EEPROM cells on the same column as the at least one programmed two-transistor FLOTOX EEPROM cell;
the row voltage control circuit applying a program inhibit gating voltage level to the word line that is sufficient to turn on the select transistor to set the channel voltage to a threshold voltage level less than the very large programming voltage level; and
the page buffer control circuit applying the ground reference voltage level to the gated bit line and thus to the gated word line;
wherein the program inhibit gating voltage level less the threshold voltage level of the select transistor is placed at the drain of the floating gate transistor and the punch-through inhibit programming voltage is placed at the source of the floating gate transistor to provide a drain-to-source voltage level of the select transistor and the floating gate transistor less than the drain-to-source breakdown voltage level of the select transistor and the floating gate transistor of each of the unselected two-transistor FLOTOX EEPROM cells on the same column as the programmed at least one two-transistor FLOTOX EEPROM cell of the selected alterable-unit.

29. The FLOTOX EEPROM device of claim 22 wherein unselected two-transistor FLOTOX EEPROM cells not on the same column or columns of the at least one programmed two-transistor FLOTOX EEPROM cell of the selected alterable-unit of two-transistor FLOTOX EEPROM cells are inhibited from programming by:
the page buffer control circuit applying the ground reference voltage level to the bit lines and source lines connected to the unselected alterable-unit of two-transistor FLOTOX EEPROM cells inhibit formation of a voltage field between the channel of the floating gate transistors and the floating gate through the thin oxide and thus initiation of the Fowler-Nordheim tunneling and programming the unselected two-transistor FLOTOX EEPROM cells.

30. The FLOTOX EEPROM device of claim 22 wherein the very large programming voltage has a magnitude of from approximately 15V to approximately 17V.

31. The FLOTOX EEPROM device of claim 22 wherein the punch through inhibit programming voltage is approximately one-half the very large programming voltage.

32. The FLOTOX EEPROM device of claim 31 wherein the punch through inhibit programming voltage is from approximately 6V to approximately 8V.

33. The two-transistor FLOTOX EEPROM cell of claim 22 wherein the program inhibit gating voltage level is from approximately 3V to approximately 5V.

34. The FLOTOX EEPROM device of claim 22 wherein the programming operation is greater than 500 μs.

35. The FLOTOX EEPROM device of claim 22 wherein the alterable-unit of two-transistor FLOTOX EEPROM cells is read by:
the page buffer control circuit applying a read biasing voltage to the bit line and thus to the drain of the select transistor of each of the two-transistor FLOTOX EEPROM cells of the alterable-unit;
the page buffer control circuit applying the ground reference voltage level to the source line and thus to the source of the floating gate transistor of each of the two-transistor FLOTOX EEPROM cells of the alterable-unit;
the row voltage control circuit applying the voltage level of the power supply voltage source is applied to the word line;
the page buffer control circuit applying a read reference voltage level to the gating bit line and thus to the control gates of the floating gate transistors are connected to the read reference voltage level; and
wherein the FLOTOX EEPROM device further comprising a sense amplifier connected to the page buffer control circuit for detecting a program state of the selected two-transistor FLOTOX EEPROM cells by a sense amplifier connected to the source line.

36. The FLOTOX EEPROM device of claim 35 wherein an unselected alterable-unit of two-transistor FLOTOX EEPROM cells is inhibited from being read by:
the page buffer control circuit applying a read biasing voltage to the bit line and thus to the drain of the select transistor of each of the two-transistor FLOTOX EEPROM cells of the alterable-unit;
the page buffer control circuit applying the ground reference voltage level to the source line and thus to the source of the floating gate transistor of each of the two-transistor FLOTOX EEPROM cells of the alterable-unit;
the row voltage control circuit applying the voltage level of the power supply voltage source to the word line;
the page buffer control circuit applying the ground reference voltage level to the gating bit line and thus the control gates of the floating gate transistors that are connected to the ground reference voltage level to insure that the unselected two-transistor FLOTOX EEPROM cells are inhibited from being read.

37. The FLOTOX EEPROM device of claim 22 wherein the source lines and bit lines associated with each column of two-transistor FLOTOX EEPROM cells comprises metal bit lines and metal source lines in parallel with the associated column of two-transistor FLOTOX EEPROM cells.

38. A method of forming FLOTOX EEPROM device comprising:
forming a two-transistor FLOTOX EEPROM array by:
forming a matrix of a plurality of two-transistor FLOTOX EEPROM cells arranged in rows and columns, wherein each two-transistor FLOTOX EEPROM cell comprises:
a select transistor, and
a floating gate thin oxide transistor having a drain merged with a source of the select transistor;
forming a plurality of bit lines, each bit line associated with one column of the two-transistor FLOTOX EEPROM cells such that each bit line is connected to the drains of the two-transistor FLOTOX EEPROM cells of the associated column;
forming a plurality of source lines, each source line associated with one column of the two-transistor FLOTOX EEPROM cells and parallel with the bit line associated with the column of two-transistor FLOTOX EEPROM cells and connected to a source of the floating gate thin oxide transistor;
forming a plurality of word lines, each word line associated with one row of the two-transistor FLOTOX EEPROM cells and connected to the gates of the select transistors of the associated row of two-transistor FLOTOX EEPROM cells and perpendicular to the bit lines and the source lines;
forming a gated bit line associated with a plurality of alterable units of the two-transistor FLOTOX EEPROM cells;
forming a plurality of gated bit line transistors, each gated bit line transistor associated with one alterable unit of two-transistor FLOTOX EEPROM cells, wherein each gated bit line transistor has a drain connected to the gated bit line associated with the alterable unit of two-transistor FLOTOX EEPROM cells, a source connected to a gated word line that is connected to a control gate of the floating gate thin oxide transistor of each of the two-transistor FLOTOX EEPROM cells in each of the alterable unit of the two-transistor FLOTOX EEPROM cells, and a gate connected to the word line associated with the row of the alterable unit of the two-transistor FLOTOX EEPROM cells; and
forming a page buffer control circuit connected to the bit lines, the source lines, and the gated bit lines of the two-transistor FLOTOX EEPROM array to transfer the control voltages to the word lines for reading and writing the two-transistor FLOTOX EEPROM cells;
wherein, during a programming operation of selected two-transistor FLOTOX EEPROM cells, the page buffer control circuit transfers a very large programming voltage through the bit lines to the drains of the select transistors of the selected two-transistor FLOTOX EEPROM cells and the page buffer control circuit transfers a punch through inhibit programming voltage through the source lines to the sources of the floating gate thin oxide transistor of the same columns of the selected two-transistor FLOTOX EEPROM cells to decrease a drain-to-source voltage of the select transistor and the floating gate thin oxide transistor.

39. The method of forming FLOTOX EEPROM device of claim 38 wherein the alterable unit of the two-transistor FLO- TOX EEPROM cells is a nibble (4 bits), a byte, a half-word (16 bits), a word, or any number of two-transistor FLOTOX EEPROM cells.

40. The method of forming FLOTOX EEPROM device of claim 38 further comprising a row voltage control circuit connected to the word lines of the two-transistor FLOTOX EEPROM array to transfer control voltages to the word lines for reading and writing the two-transistor FLOTOX EEPROM cells.

41. The method of forming FLOTOX EEPROM device of claim 38 further comprising a sense amplifier connected to the page buffer control circuit for detecting a program state of the selected two-transistor FLOTOX EEPROM cells by a sense amplifier connected to the source line.

42. The method of forming FLOTOX EEPROM device of claim 38 wherein forming the source lines and bit lines associated with each column of two-transistor FLOTOX EEPROM cells comprises constructing metal bit lines and metal source lines in parallel with the associated column of two-transistor FLOTOX EEPROM cells.

43. A method of operating FLOTOX EEPROM device comprising:
  providing the FLOTOX EEPROM device wherein the FLOTOX EEPROM device comprises:
    a two-transistor FLOTOX EEPROM array comprising:
      a matrix of a plurality of two-transistor FLOTOX EEPROM cells arranged in rows and columns, wherein each two-transistor FLOTOX EEPROM cell comprises:
        a select transistor, and
        a floating gate thin oxide transistor having a drain merged with a source of the select transistor;
      a plurality of bit lines, each bit line associated with one column of the two-transistor FLOTOX EEPROM cells such that each bit line is connected to the drains of the two-transistor FLOTOX EEPROM cells of the associated column;
      a plurality of source lines, each source line associated with one column of the two-transistor FLOTOX EEPROM cells and parallel with the bit line associated with the column of two-transistor FLOTOX EEPROM cells and connected to a source of the floating gate thin oxide transistor;
      a plurality of word lines, each word line associated with one row of the two-transistor FLOTOX EEPROM cells and connected to the gates of the select transistors of the associated row of two-transistor FLOTOX EEPROM cells and perpendicular to the bit lines and the source lines;
  programming selected two-transistor FLOTOX EEPROM cells by transferring a very large programming voltage through the bit lines to the drains of the select transistors of the selected two-transistor FLOTOX EEPROM cells and transferring a punch through inhibit programming voltage through the source lines to the sources of the floating gate thin oxide transistor of the same columns of the selected two-transistor FLOTOX EEPROM cells to decrease a drain-to-source voltage of the select transistor and the floating gate thin oxide transistor such that the drain-to-source voltage of the select transistor and the floating gate thin oxide transistor is less than a drain-to-source breakdown voltage of the select transistor and the floating gate thin oxide transistor.

44. The method of operating the FLOTOX EEPROM device of claim 43 wherein the alterable unit of the two-transistor FLOTOX EEPROM cells is a nibble (4 bits), a byte, a half-word (16 bits), a word, or any number of two-transistor FLOTOX EEPROM cells.

45. The method of operating the FLOTOX EEPROM device of claim 43 further comprising erasing at least one selected alterable-unit of two-transistor FLOTOX EEPROM cells by:
  applying a ground reference voltage level (0V) to the bit line and thus to the drain of the select transistor of each of the two-transistor FLOTOX EEPROM cells of the alterable-unit;
  applying the ground reference voltage level (0V) to the source line and thus to the source of the floating gate transistor of each of the two-transistor FLOTOX EEPROM cells of the alterable-unit;
  applying a voltage level of the power supply voltage source to the word line; and
  applying a very large erasing voltage to the gating bit line and thus to the very large erasing voltage is applied to each of the control gates of the floating gate transistors.

46. The method of operating the FLOTOX EEPROM device of claim 45 wherein the very large erasing voltage causes a voltage field between the floating gate and the channel of the floating gate transistors through a thin oxide to initiate a Fowler-Nordheim tunneling to erase the two-transistor FLOTOX EEPROM cells and wherein the very large erasing voltage has a magnitude of from approximately 15V to approximately 17V.

47. The method of operating the FLOTOX EEPROM device of claim 43 further comprising inhibiting erasing of at least one unselected alterable-unit of two-transistor FLOTOX EEPROM cells by:
  applying a ground reference voltage level (0V) to the bit line and thus to the drain of the select transistor of each of the two-transistor FLOTOX EEPROM cells of the at least one unselected alterable-unit;
  applying the ground reference voltage level (0V) to the source line and thus to the source of the floating gate transistor of each of the two-transistor FLOTOX EEPROM cells of the at least one unselected alterable-unit; ground reference voltage level to the word line and the gated bit line.

48. The method of operating the FLOTOX EEPROM device of claim 43 wherein programming at least one FLOTOX EEPROM cell within a selected alterable-unit of two-transistor FLOTOX EEPROM cells comprises:
  applying a very large programming voltage to the bit line and thus to the drain of the select transistor of the at least one programmed two-transistor FLOTOX EEPROM cell of the selected alterable-unit;
  applying a punch-through inhibit programming voltage to the source line and thus to the source of the floating gate transistor of the at least one programmed two-transistor FLOTOX EEPROM cell of the selected alterable-unit;
  applying the very large programming voltage to the word line; and
  applying the ground reference voltage level to the gating bit line and through the bit line gating transistor to the gated word lines and thus the control gates of the floating gate transistors are connected to the ground reference voltage level in some embodiments.

49. The method of operating the FLOTOX EEPROM device of claim 43 further comprises inhibiting programming the unselected two-transistor FLOTOX EEPROM cells on the same column as the at least one two-transistor FLOTOX EEPROM cells selected for programming by:

applying the very large programming voltage to the bit line and thus to the drain of the select transistor of each of the two-transistor FLOTOX EEPROM cells of the alterable-unit;

applying the punch-through inhibit programming voltage to the source line and thus to the source of the floating gate transistor of each of the two-transistor FLOTOX EEPROM cells on the same column as the at least one programmed two-transistor FLOTOX EEPROM cell;

applying a program inhibit gating voltage level to the word line that is sufficient to turn on the select transistor to set the channel voltage to a threshold voltage level less than the very large programming voltage level; and applying the ground reference voltage level to the gated bit line and thus to the gated word line;

wherein the program inhibit gating voltage level less the threshold voltage level of the select transistor is placed at the drain of the floating gate transistor and the punch-through inhibit programming voltage is placed at the source of the floating gate transistor to provide a drain-to-source voltage level of the select transistor and the floating gate transistor less than the drain-to-source breakdown voltage level of the select transistor and the floating gate transistor of each of the unselected two-transistor FLOTOX EEPROM cells on the same column as the programmed at least one two-transistor FLOTOX EEPROM cell of the selected alterable-unit.

50. The method of operating the FLOTOX EEPROM device of claim 43 further comprises inhibiting programming unselected two-transistor FLOTOX EEPROM cells not on the same column or columns of the at least one programmed two-transistor FLOTOX EEPROM cell of the selected alterable-unit of two-transistor FLOTOX EEPROM cells by:

applying the ground reference voltage level to the bit lines and source lines connected to the unselected alterable-unit of two-transistor FLOTOX EEPROM cells inhibit formation of a voltage field between the channel of the floating gate transistors and the floating gate through the thin oxide and thus initiation of the Fowler-Nordheim tunneling and programming the unselected two-transistor FLOTOX EEPROM cells.

51. The method of operating the FLOTOX EEPROM device of claim 43 wherein the very large programming voltage has a magnitude of from approximately 15V to approximately 17V.

52. The method of operating the FLOTOX EEPROM device of claim 43 wherein the punch through inhibit programming voltage is approximately one-half the very large programming voltage.

53. The method of operating the FLOTOX EEPROM device of claim 52 wherein the punch through inhibit programming voltage is from approximately 6V to approximately 8V.

54. The method of operating the FLOTOX EEPROM device of claim 50 wherein the program inhibit gating voltage level is from approximately 3V to approximately 5V.

55. The method of operating the FLOTOX EEPROM device of claim 43 wherein programming operation has a duration greater than 500 μs.

56. The method of operating the FLOTOX EEPROM device of claim 43 further comprising reading the alterable-unit of two-transistor FLOTOX EEPROM cells by:

applying a read biasing voltage to the bit line and thus to the drain of the select transistor of each of the two-transistor FLOTOX EEPROM cells of the alterable-unit;

applying the ground reference voltage level to the source line and thus to the source of the floating gate transistor of each of the two-transistor FLOTOX EEPROM cells of the alterable-unit;

applying the voltage level of the power supply voltage source is applied to the word line;

applying a read reference voltage level to the gating bit line and thus to the control gates of the floating gate transistors are connected to the read reference voltage level; and wherein the FLOTOX EEPROM device wherein further comprising a sense amplifier connected to the page buffer control circuit for detecting a program state of the selected two-transistor FLOTOX EEPROM cells by a sense amplifier connected to the source line.

57. The method of operating the FLOTOX EEPROM device of claim 35 further comprising inhibiting reading an unselected alterable-unit of two-transistor FLOTOX EEPROM cells by:

applying a read biasing voltage to the bit line and thus to the drain of the select transistor of each of the two-transistor FLOTOX EEPROM cells of the alterable-unit;

applying the ground reference voltage level to the source line and thus to the source of the floating gate transistor of each of the two-transistor FLOTOX EEPROM cells of the alterable-unit;

applying the voltage level of the power supply voltage source to the word line;

applying the ground reference voltage level to the gating bit line and thus the control gates of the floating gate transistors that are connected to the ground reference voltage level to insure that the unselected two-transistor FLOTOX EEPROM cells are inhibited from being read.

58. The method of operating the FLOTOX EEPROM device of claim 43 wherein the source lines and bit lines associated with each column of two-transistor FLOTOX EEPROM cells comprises metal bit lines and metal source lines in parallel with the associated column of two-transistor FLOTOX EEPROM cells.

* * * * *